United States Patent
Lee et al.

(10) Patent No.: US 12,368,443 B2
(45) Date of Patent: Jul. 22, 2025

(54) SEMICONDUCTOR DEVICE

(71) Applicant: Samsung Electronics Co., Ltd., Suwon-si (KR)

(72) Inventors: Jinwook Lee, Suwon-si (KR); Joohwan Kim, Suwon-si (KR); Junyoung Park, Suwon-si (KR); Jindo Byun, Suwon-si (KR); Eunseok Shin, Suwon-si (KR); Junghwan Choi, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 18/350,606

(22) Filed: Jul. 11, 2023

(65) Prior Publication Data

US 2024/0187002 A1    Jun. 6, 2024

(30) Foreign Application Priority Data

Dec. 2, 2022    (KR) .................. 10-2022-0166244

(51) Int. Cl.
*H03L 7/081* (2006.01)
*G11C 7/22* (2006.01)
*H03K 5/135* (2006.01)

(52) U.S. Cl.
CPC ............ *H03L 7/0812* (2013.01); *G11C 7/222* (2013.01); *H03K 5/135* (2013.01)

(58) Field of Classification Search
None
See application file for complete search history.

(56) References Cited

U.S. PATENT DOCUMENTS

| | | | |
|---|---|---|---|
| 6,459,314 B2 | 10/2002 | Kim | |
| 7,728,638 B2 | 6/2010 | Varricchione | |
| 9,160,350 B2 | 10/2015 | Zerbe et al. | |
| 9,667,252 B1 | 5/2017 | Lee et al. | |
| 11,742,016 B2 * | 8/2023 | Yoon | H03K 5/1565 365/149 |
| 2022/0247417 A1 | 8/2022 | Rosen et al. | |

FOREIGN PATENT DOCUMENTS

| | | |
|---|---|---|
| KR | 2010/0066236 A | 6/2010 |
| KR | 102399541 B1 | 5/2022 |

* cited by examiner

*Primary Examiner* — Cassandra F Cox

(74) *Attorney, Agent, or Firm* — Harness, Dickey & Pierce, P.L.C.

(57) ABSTRACT

A semiconductor device includes a phase splitter configured to output a plurality of clock signals having different phases by using a plurality of external clock signals having different phases, a plurality of code generators configured to receive a pair of selection clock signals determined from the plurality of clock signals and to output a phase code corresponding to a phase difference error between the pair of selection clock signals, and a delay circuit configured to at least partly simultaneously adjust at least two of a rising edge and a falling edge of each of the plurality of external clock signals with reference to the phase code during a lock time.

20 Claims, 23 Drawing Sheets

SEMICONDUCTOR DEVICE

CROSS-REFERENCE TO RELATED APPLICATION(S)

This application claims benefit of priority to Korean Patent Application No. 10-2022-0166244 filed on Dec. 2, 2022 in the Korean Intellectual Property Office, the disclosure of which is incorporated herein by reference in its entirety.

BACKGROUND

Various example embodiments relate to a semiconductor device.

The semiconductor device may be or include a device reading and/or writing data, and may operate using a clock signal transmitted eternally by a different semiconductor device. In order to increase a data transmission speed and improve a data processing speed with the different semiconductor device, the semiconductor device may include a clock circuit generating a plurality of clock signals having different phases. In order to improve performance of the semiconductor device, it is necessary to accurately set a phase difference of a plurality of clock signals in which the clock circuit outputs, and to remove a skew.

SUMMARY

Various example embodiments provide a semiconductor device, when phases of a plurality of clock signals having different phases are adjusted, adjusting phases of two or more clock signals at the same time, to shorten a lock time period for adjusting phases of clock signals and to set phases of clock signals more accurately within a limited lock time period.

According to some example embodiments, a semiconductor device includes a clock receiver configured to receive from an external semiconductor device a first clock signal and a second clock signal having a phase difference from the first clock signal; a delay circuit configured to adjust at least one of a falling edge of the first clock signal, a rising edge of the second clock signal, and a falling edge of the second clock signal; a phase splitter configured to receive the first clock signal to output a first complementary clock signal, which is a complementary signal of the first clock signal, and receive the second clock signal to output a second complementary clock signal, which is a complementary signal of the second clock signal; and a code generator configured to output phase codes to the delay circuit. The code generator is configured to output to the delay circuit during a first unit time period, a first phase code adjusting a phase difference between the first clock signal and the second clock signal and a second phase code adjusting a phase difference between the first complementary clock signal and the second complementary clock signal, and to output to the delay circuit during a second unit time period, different from the first unit time period, a third phase code adjusting a phase difference between the second clock signal and the first complementary clock signal and a fourth phase code adjusting a phase difference between the first clock signal and the second complementary clock signal.

Alternatively or additionally according to some example embodiments, a semiconductor device includes a first delay circuit configured to adjust a falling edge of a first clock signal; a second delay circuit configured to adjust a rising edge and a falling edge of a second clock signal having a phase, different from a phase of the first clock signal; a first phase splitter configured to receive the first clock signal from the first delay circuit and to output the first clock signal and a first complementary clock signal, which is a complementary signal of the first clock signal; a second phase splitter configured to receive the second clock signal from the second delay circuit and to output the second clock signal and a second complementary clock signal, which is a complementary signal of the second clock signal; and a first code generator and a second code generator, configured to receive a portion of the first clock signal, the first complementary clock signal, the second clock signal, the second complementary clock signal, and to output phase codes to at least one of the first delay circuit and the second delay circuit.

Alternatively or additionally according to some example embodiments, a semiconductor device includes a phase splitter configured to output a plurality of clock signals having different phases by using a plurality of external clock signals having different phases, a plurality of code generators configured to receive a pair of selection clock signals determined from the plurality of clock signals, and to output a phase code corresponding to a phase difference error between the pair of selection clock signals, and a delay circuit configured to at least partly simultaneously adjust at least two of a rising edge and a falling edge of each of the plurality of external clock signals with reference to the phase code during a lock time.

BRIEF DESCRIPTION OF DRAWINGS

The above and other aspects, features, and advantages of inventive concepts will be more clearly understood from the following detailed description, taken in conjunction with the accompanying drawings, in which.

DETAILED DESCRIPTION

Hereinafter, various example embodiments of inventive concepts will be described below with reference to the accompanying drawings.

Figure 1:
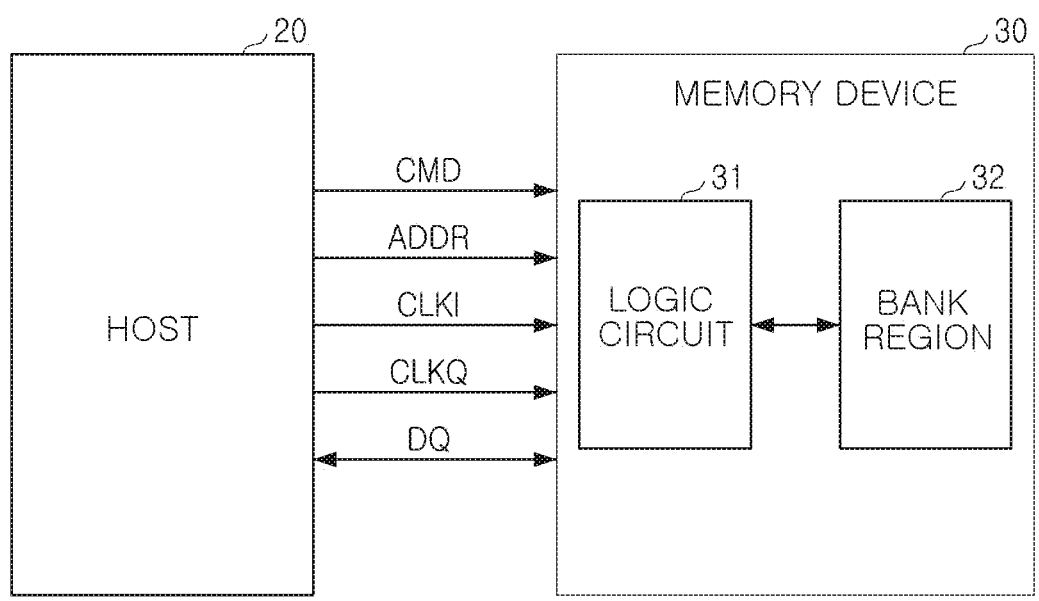
FIG. 1 is a block diagram schematically illustrating a system including a semiconductor device according to some example embodiments.

FIG. 1 is a block diagram schematically illustrating a system including a semiconductor device according to some example embodiments.

Referring to FIG. 1, a system 10 according to some example embodiments may include a host 20 and a memory device 30. A semiconductor device according to some example embodiments may be the host 20 or the memory device 30. Hereinafter, for convenience of description, it will be described assuming that the memory device 30 storing data may be or may include or be included in a semiconductor device according to some example embodiments.

The host 20 may be or include or be included in an operation processing device such as an application processor, a central processing unit, a system-on-chip, or the like. The host 20 may include a memory controller controlling the memory device 30, and may transmit a data signal DQ to the memory device 30 and/or receive the data signal DQ from the memory device 30. In addition, the host 20 may transmit a command signal CMD, an address signal ADDR, a first clock signal CLKI, a second clock signal CLKQ, and/or the like to the memory device 30.

The first clock signal CLKI and the second clock signal CLKQ provided by the host 20 to the memory device 30 may be external clock signals, and may have different phases. For example, the first clock signal CLKI and the second clock signal CLKQ may have the same frequency and the same duty ratio, and the second clock signal CLKQ may have a phase of 90 degrees later than (or 270 degrees earlier than) the first clock signal CLKI.

The memory device 30 may include a logic circuit 31, a bank region 32, and/or the like. The logic circuit 31 may include a transmission circuit (not separately illustrated in FIG. 1) outputting the data signal DQ to the host 20, and a reception circuit receiving the data signal DQ, the command signal CMD, the address signal ADDR, and the like from the host 20. Alternatively or additionally, the logic circuit 31 may include a clock circuit (not separately illustrated in FIG. 1) generating a plurality of clock signals having different phases using the first clock signal CLKI and the second clock signal CLKQ. For example, the reception circuit may synchronize the plurality of clock signals to parallelize the data signal DQ received from the host 20, and the transmission circuit may synchronize the plurality of clock signals to serialize data to be output to the host 20. In some example embodiments, the transmission circuit and the reception circuit may be separate from each other; alternatively in some example embodiments, the transmission circuit and the reception circuit may be combined into a common transceiver circuit (not illustrated).

Due to a difference in delay in a signal transmission path between the host 20 and the memory device 30, delay generated in the memory device 30, or the like, there may be an error in a phase difference of the plurality of clock signals generated by the clock circuit using the first clock signal CLKI and the second clock signal CLKQ. For example, when the clock circuit generates first to fourth clock signals having a phase difference of 90 degrees using the first clock signal CLKI and the second clock signal CLKQ, a phase difference between at least a portion of the clock signals may be 90 degrees different.

The clock circuit may adjust the phase difference of the first to fourth clock signals within a lock time such as a dynamically determined lock time (or, alternatively, a predetermined lock time). For example, the clock circuit may adjust the phase difference of the first to fourth clock signals by selecting two clock signals from the first to fourth clock signals, and repeating an operation of adjusting a phase difference between the two clock signals. For example, the clock circuit may adjust a phase difference of the first to fourth clock signals by advancing or delaying timing of a rising edge of a different clock signal, based on a rising edge of one of the selected two clock signals.

The lock time may be predetermined or dynamically determined based on a specification of the memory device 30. Therefore, to eliminate or reduce or mitigate an error in the phase difference of the first to fourth clock signals during the predetermined lock time, the clock circuit needs to or should more effectively adjust phases of the first to fourth clock signals. In some example embodiments, phase differences between two pairs of clock signals may be simultaneously adjusted in a first unit time period and a second unit time period, respectively, in which the clock circuit of the memory device 30 may be repeated during the lock time. Therefore, a lock time may be shortened, and/or a phase difference of the clock signals may be more effectively removed without increasing the lock time even when an initial phase difference of the clock signals is relatively large.

Figure 2:
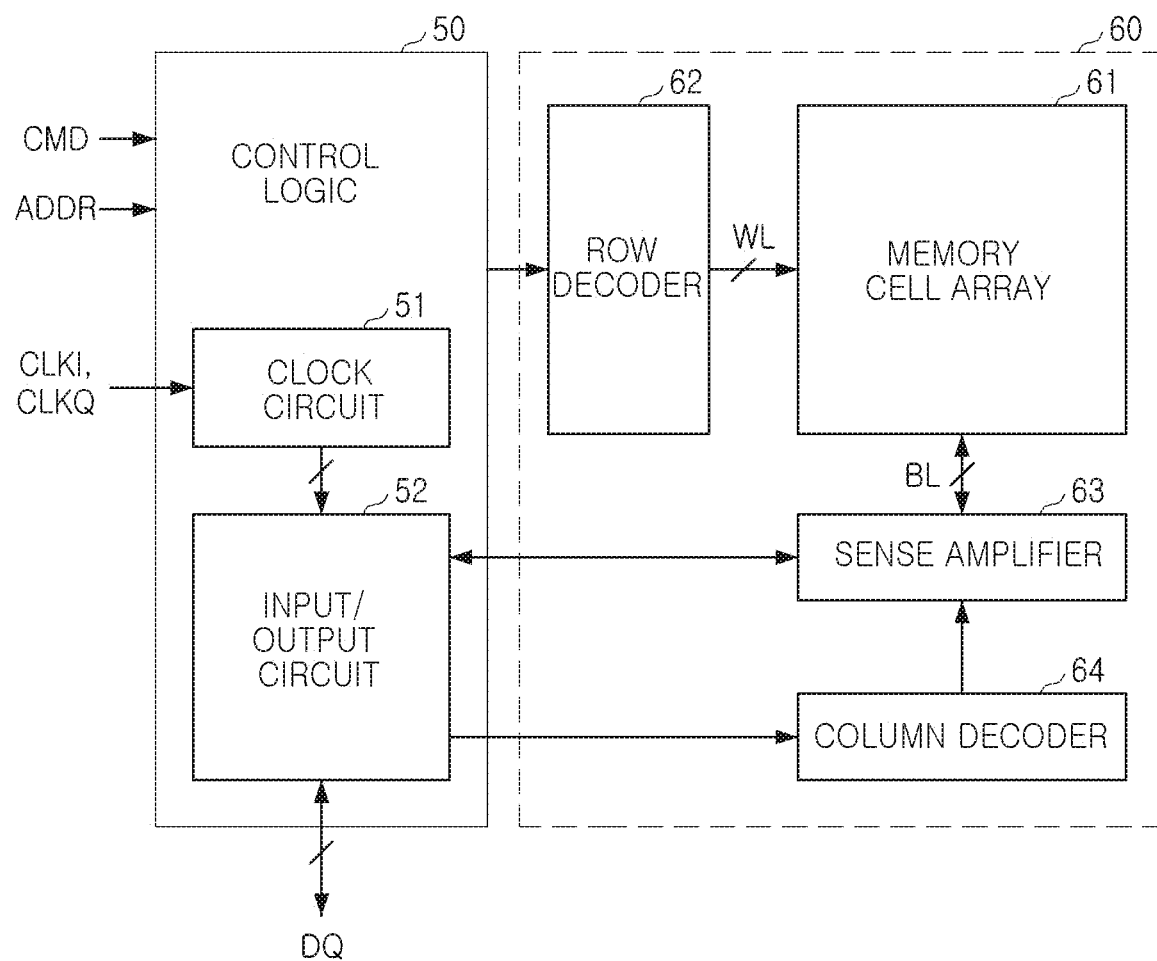
FIG. 2 is a block diagram schematically illustrating a semiconductor device according to some example embodiments.

FIG. 2 is a block diagram schematically illustrating a semiconductor device according to some example embodiments.

Referring to FIG. 2, a semiconductor device 40 may be a storage device based on a semiconductor element. In some example embodiments illustrated in FIG. 2, the semiconductor device 40 is illustrated as being a random access memory such as one or more of a DRAM, MRAM, PRAM, or the like, but the semiconductor device 40 may be or include or be included in a non-volatile memory device such as a NAND memory. The semiconductor device 40 may store data received through a data signal DQ in response to an address signal ADDR and a command signal CMD received from an external host (e.g., a CPU, an application processor AP, and a system-on-chip SoC), and/or may output data as a data signal DQ. The semiconductor device 40 may include a control logic 50 and a bank region 60, and the semiconductor device 40 may include, for example, a plurality of bank regions 60. In some example embodiments, the semiconductor device 40 may be or correspond to the memory device 30 illustrated in FIG. 1.

The bank region 60 may include a memory cell array 61, a row decoder 62, a sense amplifier 63, a column decoder 64, redundancy circuitry (not illustrated) and the like. The memory cell array 61 may include a plurality of memory cells, and the plurality of memory cells may be connected to the row decoder 62 and the sense amplifier 63, through a plurality of word lines WL and a plurality of bit lines BL. For example, each of the plurality of memory cells may be located at or near a point at which the plurality of word lines WL and the plurality of bit lines BL intersect. The plurality of memory cells may be arranged in a matrix form such as a rectangular or square matrix form in the memory cell array 61, and each of the plurality of memory cells may include at least one memory element for storing data.

The control logic 50 may receive an address signal ADDR, a command signal CMD, a first clock signal CLKI, a second clock signal CLKQ, and the like from a host. The address signal ADDR may include a row address indicating a row (or word line) in the memory cell array 61, and a column address indicating a column (or bit line) in the memory cell array 61. For example, the row decoder 62 may select at least one word line WL, among the plurality of word lines WL, with reference to the row address, and the column decoder 64 may select the sense amplifier connected to at least one bit line BL, among the plurality of bit lines BL, with reference to the column address.

The sense amplifier 63 may include a plurality of bit line sense amplifiers connected to the memory cell array 61 through the plurality of bit lines BL. When a read operation is executed, a bit line sense amplifier connected to a selected bit line by the column decoder 64, among the plurality of bit line sense amplifiers, may read at least one data from memory cells connected to the selected bit line, for example by amplifying a voltage difference between adjacent bit lines. The input/output circuit 52 of the control logic 50 may output data read by the bit line sensing amplifier as the data signal DQ.

The control logic 50 may include various logic circuits controlling the bank region 60, and may include, for example, a clock circuit 51 and an input/output circuit 52. The clock circuit 51 may receive a first clock signal CLKI and a second clock signal CLKQ from an external device, such as a host, and may generate a plurality of clock signals based on at least the first clock signal CLK1 and the second clock signal CLKQ so as to provide the same to the input/output circuit 52. The input/output circuit 52 may synchronize with the plurality of clock signals to output a data signal DQ, or may extract data from the data signal DQ received externally.

The clock circuit 51 may include one or more of a code generator generating a phase code that adjusts a phase of a clock signal, a delay circuit adjusting timing of rising and/or falling edges of a clock signal based on a phase code, a clock tree providing a transmission path of a clock signal, or the like. Hereinafter, a configuration and an operation of the clock circuit 51 will be described in more detail with reference to FIG. 3.

Figure 3:
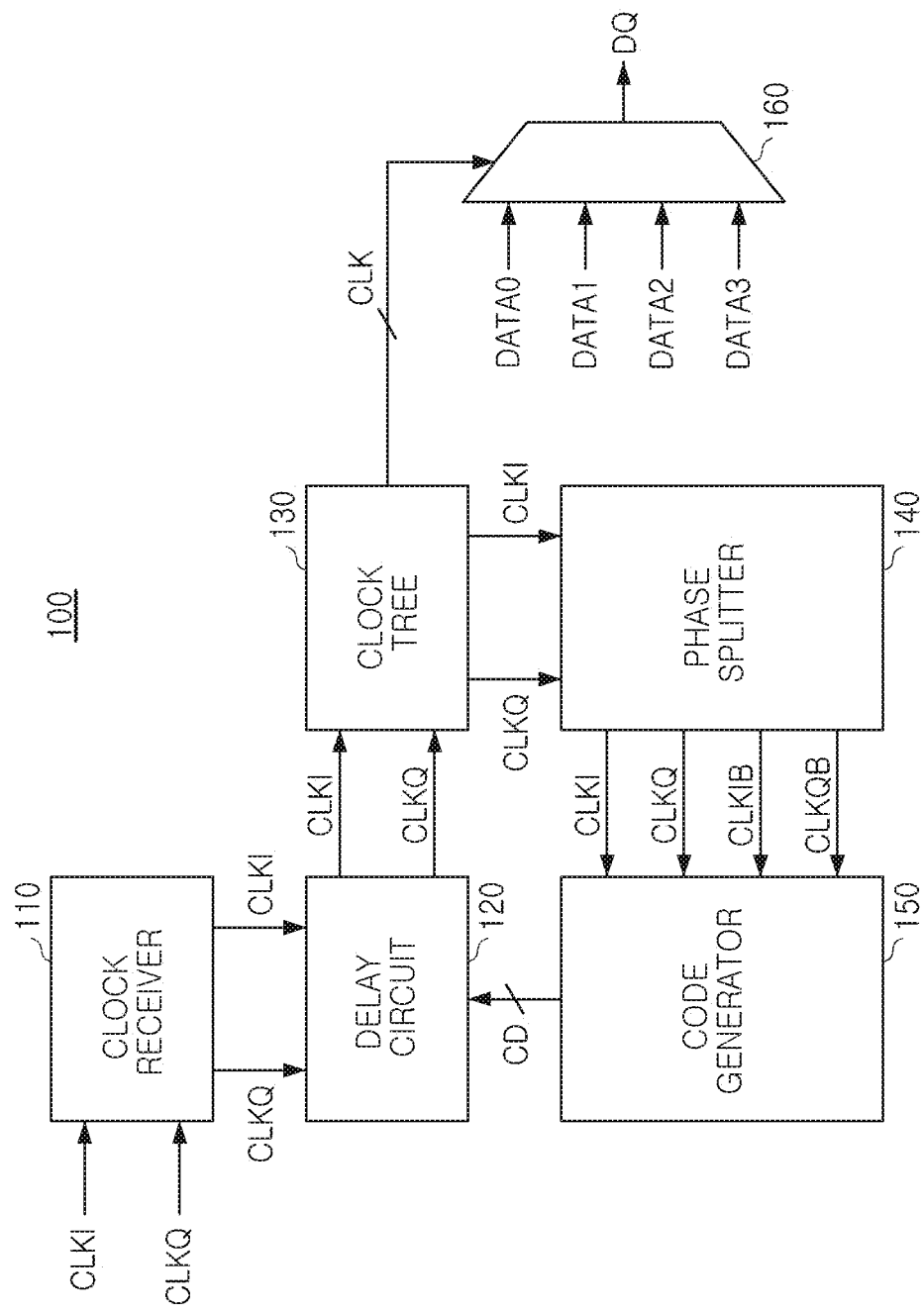
FIG. 3 is a view schematically illustrating a semiconductor device according to some example embodiments.

FIG. 3 is a view schematically illustrating a semiconductor device according to some example embodiments.

Referring to FIG. 3, a clock circuit included in a semiconductor device 100 according to some example embodiments may include a clock receiver 110, a delay circuit 120, a clock tree 130, a phase splitter 140, a code generator 150, and the like. A plurality of clock signals CLK output by the clock circuit may be input to a multiplexer 160, and the multiplexer 160 may select one of a plurality of internal data signals DATA0 to DATA3 at a rising edge of each of the clock signals CLK, and may output the same as a data signal DQ. Therefore, a speed of the data signal DQ may be faster than a speed of each of the plurality of internal data signals DATA0 to DATA3.

The clock receiver 110 may include one or more receivers that receive a first clock signal CLKI and a second clock signal CLKQ. The first clock signal CLKI and the second clock signal CLKQ, received by the clock receiver 110, may be transmitted to the delay circuit 120, and the delay circuit 120 may adjust timing of at least one of a rising edge or a falling edge of either or both of the first clock signal CLKI and the second clock signal CLKQ. For example, the delay circuit 120 may adjust the falling edge of the first clock signal CLKI and the rising edge and the falling edge of the second clock signal CLKQ, based on a phase code CD received from the code generator 150. In this case, the rising edge of the first clock signal CLKI may not be adjusted, e.g. as or at a dynamically determined or predetermined reference time point.

The first clock signal CLKI and the second clock signal CLKQ, output from the delay circuit 120, may be transmitted to the phase splitter 140 through the clock tree 130. The clock tree 130 may include at least one repeater for transmitting the first clock signal CLKI and the second clock signal CLKQ.

The phase splitter 140 may generate first to fourth clock signals CLKI, CLKQ. CLKIB, and CLKQB using the first clock signal CLKI and the second clock signal CLKQ. For example, the first clock signal CLKI and the second clock signal CLKQ may have a phase difference of 90 degrees. The phase splitter 140 may generate a third clock signal CLKIB which may be a complementary signal of the first clock signal CLKI, and a fourth clock signal CLKQB which may be a complementary signal of the second clock signal CLKQ.

The code generator 150 may select two or more clock signals from the first to fourth clock signals CLKI, CLKQ, CLKIB, and CLKQB, and may output a phase code CD adjusting a phase difference between selected clock signals. In some example embodiments, the code generator 150 may receive a pair of first selection clock signals and a pair of second selection clock signals from the first to fourth clock signals CLKI, CLKQ, CLKIB, and CLKQB. For example, at least one of the pair of first selection clock signals may be a clock signal, different from each of the pair of second selection clock signals.

The code generator 150 may compare first selection clock signals with each other so as to generate a phase code, and may compare second selection clock signals with each other so as to generate another phase code. The delay circuit 120 may adjust timing of one of the falling edge of the first clock signal CLKI and the rising edge and the falling edge of the second clock signal CLKQ, based on the phase code generated by comparing the first selection clock signals with each other. In addition, the delay circuit 120 may adjust timing of one of the falling edge of the first clock signal CLKI and the rising edge and the falling edge of the second clock signal CLKQ, based on the phase code generated by comparing the second selection clock signals with each other.

For example, the delay circuit 120 may simultaneously or at least partially simultaneously adjust timing of two of the falling edge of the first clock signal CLKI and the rising edge and the falling edge of the second clock signal CLKQ. Therefore, a lock time may be shortened, and/or a phase difference error between the first to fourth clock signals CLKI, CLKQ, CLKIB, and CLKQB may be more effectively eliminated without increasing the lock time. Alternatively or additionally, the number of bits of a phase code CD input to the delay circuit 120 may increase to improve resolution of removal of the phase difference error within the same lock time.

Figure 4:
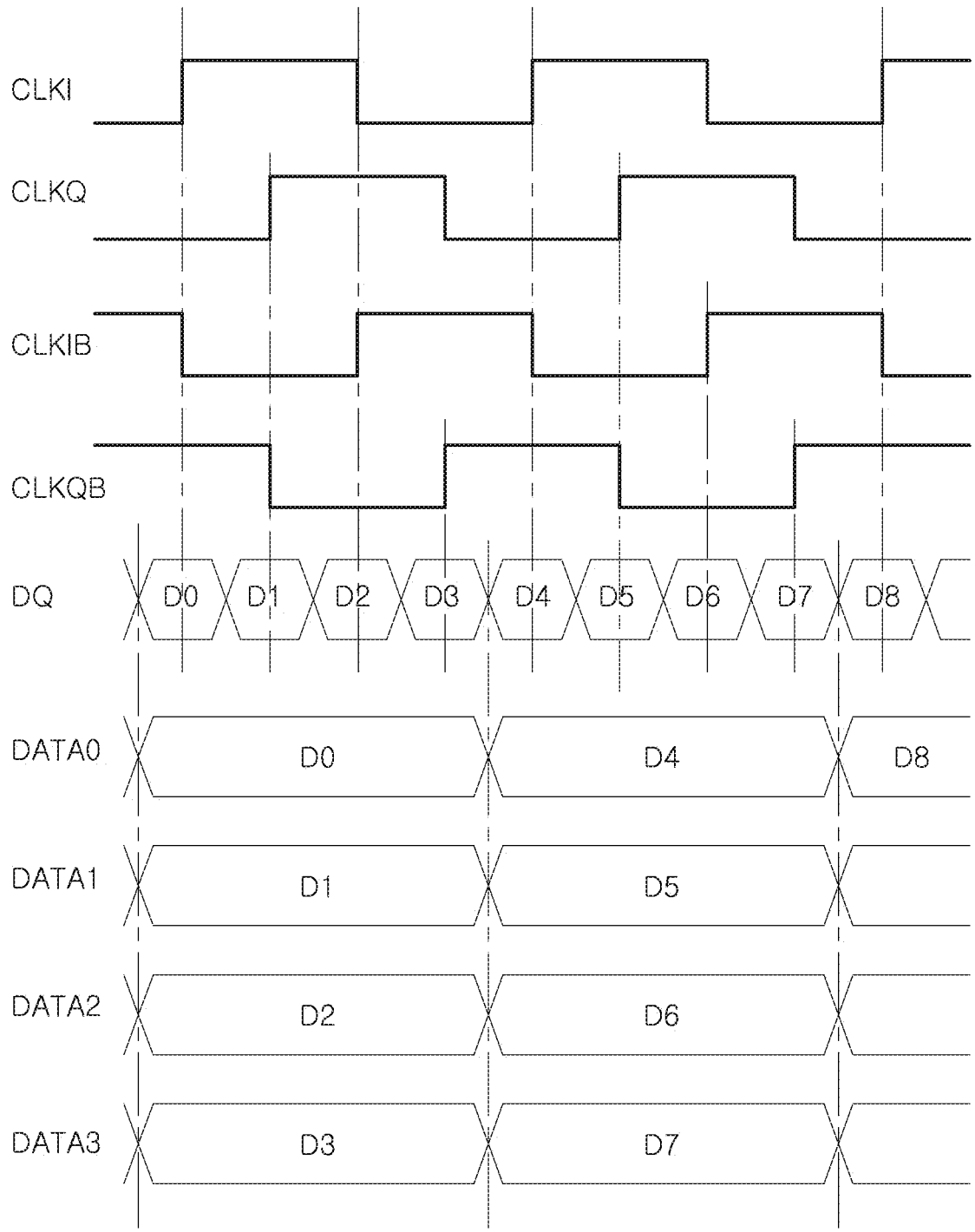
FIG. 4 is a view illustrating an operation of a semiconductor device according to some example embodiments.

FIG. 4 is a view illustrating an operation of a semiconductor device according to some example embodiments.

FIG. 4 may be or may correspond to a timing diagram illustrating an operation of the semiconductor device 100 described with reference to FIG. 3. Referring to FIG. 4, first to fourth clock signals CLKI, CLKQ, CLKIB, and CLKQB may have different phases. For example, the first clock signal CLKI and the second clock signal CLKQ may have a phase difference of 90 degrees, the first clock signal CLKI and the third clock signal CLKIB may have a complementary relationship, and the second clock signal CLKQ and the fourth clock signal CLKQB may have a complementary relationship.

A plurality of internal data signals DATA0 to DATA3 generated in a semiconductor device 100 may have or may operate at the same speed or frequency. As described with reference to FIG. 3, a multiplexer 160 may receive the plurality of internal data signals DATA0 to DATA3 and the first to fourth clock signals CLKI, CLKQ. CLKIB, and CLKQB, and may select one of the plurality of internal data signals DATA0 to DATA3 at a rising edge of each of the first to fourth clock signals CLKI, CLKQ, CLKIB, and CLKQB, so as to output the same as a data signal DQ.

Referring to FIG. 4, at a first rising edge of the first clock signal CLKI, first data D0 transmitted to a first internal data signal DATA0 may be selected so as to be output as a data signal DQ, and, at a first rising edge of the second clock signal CLKQ, second data D1 transmitted to a second internal data signal DATA1 may be selected as a data signal DQ. Similarly, at a first rising edge of the third clock signal CLKIB, a third data D2 transmitted to a third internal data signal DATA2 may be output as a data signal DQ, and at a first rising edge of the fourth clock signal CLKQB, a fourth data D3 transmitted to a fourth internal data signal DATA2 may be output as a data signal DQ. Therefore, in the semiconductor device 100 according to some example embodiments described with reference to FIG. 3, a transmission speed of the data signal DQ may be improved by four times a transmission speed of each of the plurality of internal data signals DATA0 to DATA3.

Figure 5:
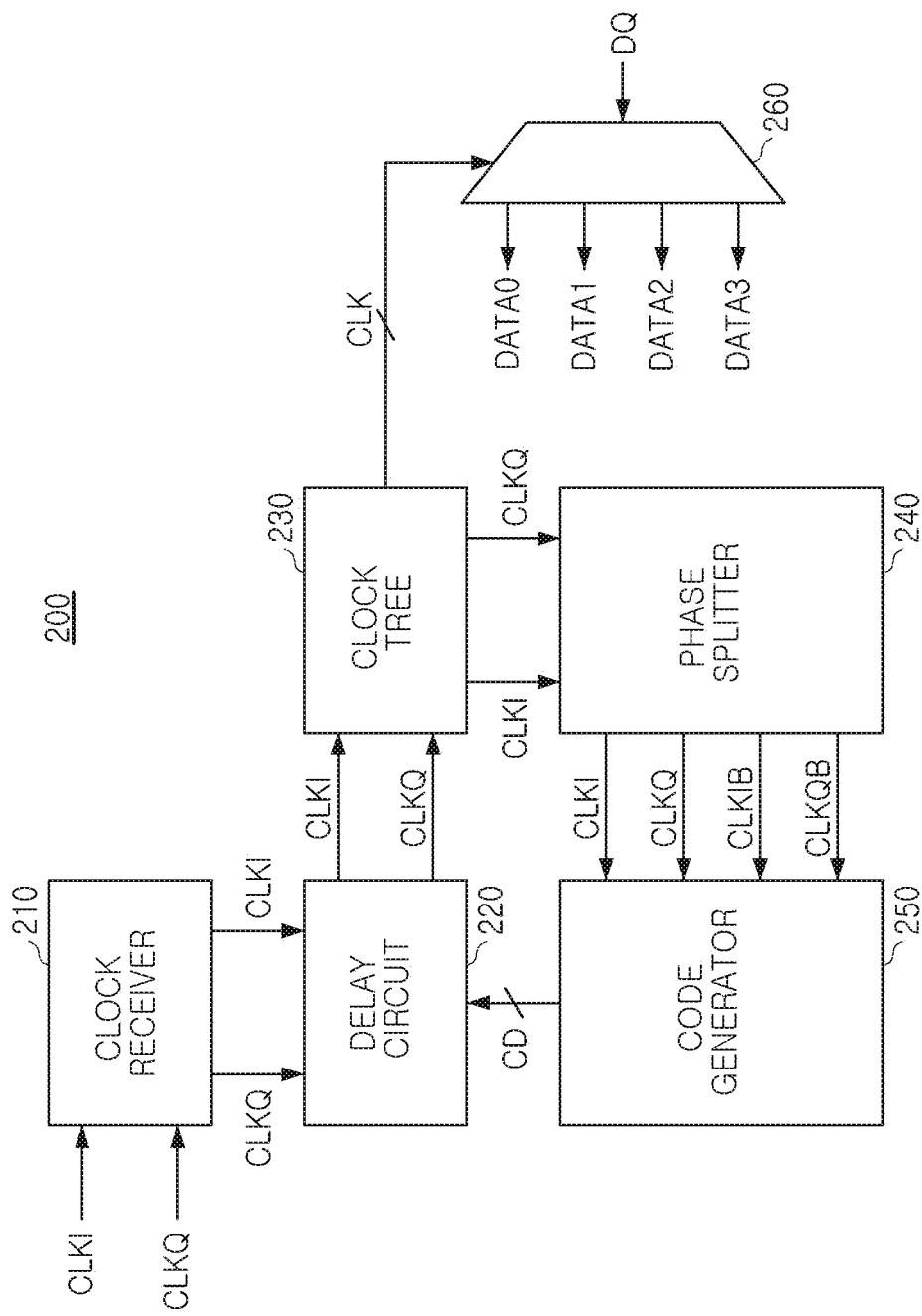
FIG. 5 is a view schematically illustrating a semiconductor device according to some example embodiments.

FIG. 5 is a view schematically illustrating a semiconductor device according to some example embodiments.

Referring to FIG. 5, the semiconductor device 200 according to some example embodiments may include a clock receiver 210, a delay circuit 220, a clock tree 230, a phase splitter 240, a code generator 250, and the like. The clock receiver 210, the delay circuit 220, the clock tree 230, the phase splitter 240, the code generator 250, and the like may provide a clock circuit, and the clock circuit may output a plurality of clock signals CLK to a demultiplexer 260. Some example embodiments illustrated in FIG. 5 may correspond to a circuit in which the semiconductor device 200 receives a data signal DQ externally to generate a plurality of internal data signals DATA0 to DATA3.

For example, the demultiplexer 260 may select and send data included in the data signal DQ to one of the plurality of internal data signals DATA0 to DATA3 at a rising edge of each of the plurality of clock signals CLK. A speed of each of the plurality of internal data signals DATA0 to DATA3 output by the demultiplexer 260 may be slower than a speed of the data signal DQ. Operations of the clock receiver 210, the delay circuit 220, the clock tree 230, the phase splitter 240, the code generator 250, and/or the like may be the same as those described above with reference to FIG. 3. In some example embodiments, one clock circuit may generate a plurality of clock signals CLK so as to provide the same to a transmission circuit and a reception circuit, respectively.

Figure 6A:
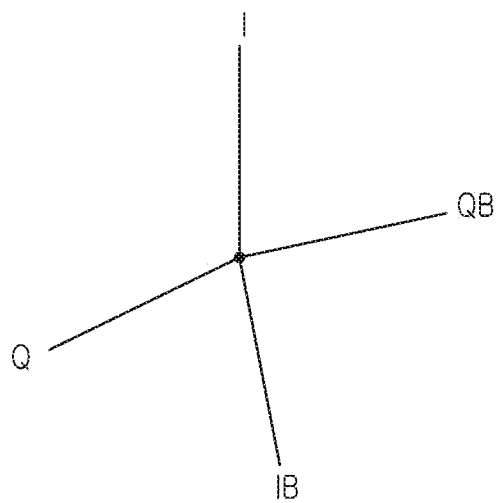
FIGS. 6A and 6B are views illustrating an operation of a semiconductor device according to some example embodiments.
Figure 6B:
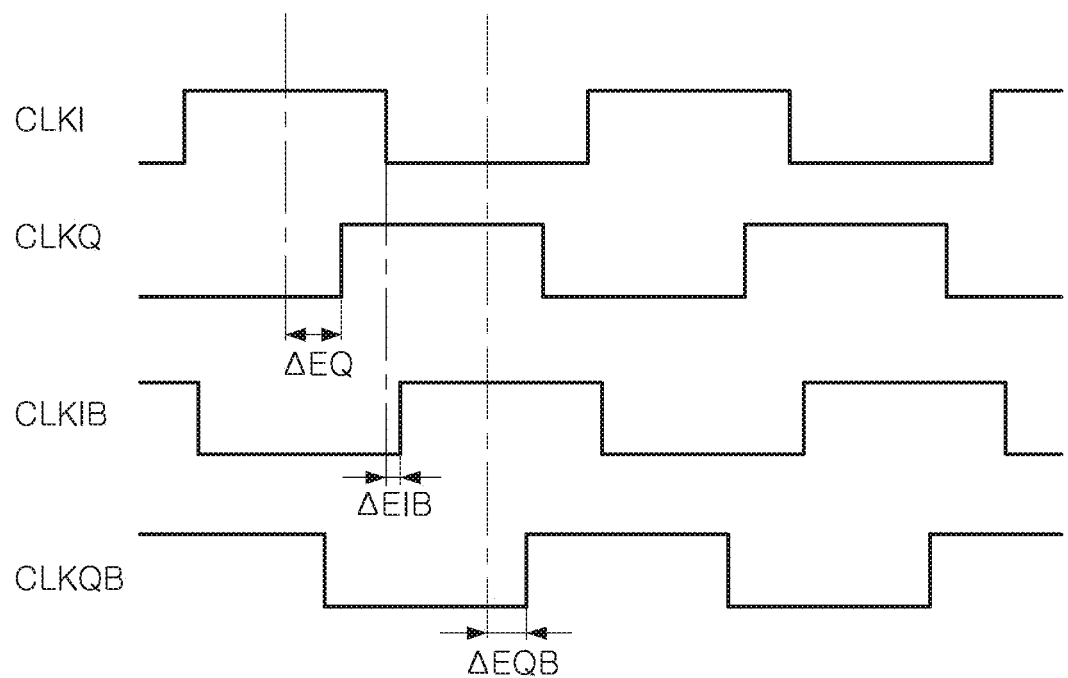

FIGS. 6A and 6B are views illustrating an operation of a semiconductor device according to some example embodiments.

FIGS. 6A and 6B are views illustrating a first clock signal CLKI and a second clock signal CLKQ, in which a semiconductor device receives from an external host or the like before or at the start of a lock time, and a third clock signal CLKIB and a fourth clock signal CLKQB, in which the semiconductor device generates from the first clock signal CLKI and the second clock signal CLKQ. FIG. 6A may be a view illustrating a phase difference (e.g. a phase difference in the complex plane) of rising edges of each of the first to fourth clock signals CLKI, CLKQ. CLKIB, and CLKQB, and FIG. 6B may be a timing diagram illustrating the first to fourth clock signals CLKI, CLKQ. CLKIB, and CLKQB. Phase differences illustrated in FIGS. 6A and/or 6B may be exaggerated for clarity; example embodiments are not limited thereto.

As described above, in an ideal case, first to fourth clock signals CLKI, CLKQ. CLKIB, and CLKQB may have a phase difference of 90 degrees. For example, a rising edge of the second clock signal CLKQ may have a phase later than a rising edge of the first clock signal CLKI, a rising edge of the third clock signal CLKIB may have a phase later than the rising edge of the second clock signal CLKQ, and a rising edge of the fourth clock signal CLKQB may have a phase 90 degrees later than the rising edge of the third clock signal CLKIB. For example, the rising edge of the third clock signal CLKIB may have a phase 180 degrees later than the rising edge of the first clock signal CLKI, and the rising edge of the fourth clock signal CLKQB may have a phase 270 degrees later than the rising edge of the first clock signal CLKI.

Phases of the first to fourth clock signals CLKI, CLKQ, CLKIB, and CLKQB generated in the semiconductor device, before the lock time, may not be as described above. Referring to FIG. 6A, a rising edge of the second clock signal CLKQ may have a phase greater than 90 degrees later than a rising edge of the first clock signal CLKI, and a rising edge of the third clock signal CLKIB may have a phase of less than 180 degrees earlier than the rising edge of the second clock signal CLKI. A rising edge of the fourth clock signal CLKQB may have a phase of less than 90 degrees earlier than the rising edge of the third clock signal CLKIB.

A phase difference error between the first to fourth clock signals CLKI, CLKQ. CLKIB, and CLKQB may be expressed such as the timing diagram of FIG. 6B. Referring to FIG. 6B, a phase difference between the first clock signal CLKI and the second clock signal CLKQ may be greater than 90 degrees due to a first phase difference error ΔEQ. Similarly, a phase difference between the first clock signal CLKI and the third clock signal CLKIB may be greater than 180 degrees due to a second phase difference error ΔEIB, and a phase difference between the first clock signal CLKI and the fourth clock signal CLKQB may be greater than 270 degrees due to a third phase difference error ΔEQB.

In a semiconductor device according to various example embodiments, a clock circuit may reduce the phase difference errors ΔEQ, ΔEIB, and ΔEQB between first to fourth clock signals CLKI, CLKQ. CLKIB, and CLKQB within a lock time. For example, the lock time may include a first unit time period and a second unit time period, alternately repeated, and the clock circuit may generate phase codes so as to reduce two or more phase difference errors, among the phase difference errors ΔEQ, ΔEIB, and ΔEQB, at each of the first unit time period and the second unit time period. Therefore, the clock circuit may simultaneously adjust rising edge timing of two or more clock signals, among the first to fourth clock signals CLKI, CLKQ. CLKIB, and CLKQB, for one unit time period, and may more effectively reduce the phase difference errors ΔEQ, ΔEIB, and ΔEQB within a predetermined or dynamically determined lock time, and/or may reduce a total lock time.

For example, within one unit time period, the clock circuit may simultaneously adjust the rising edge of the second clock signal CLKB and the rising edge of the fourth clock signal CLKQB. In this manner, the rising edge timing of the two or more clock signals may be simultaneously adjusted within one unit time period, and an efficiency of an operation during the lock time may be improved.

Figure 7:
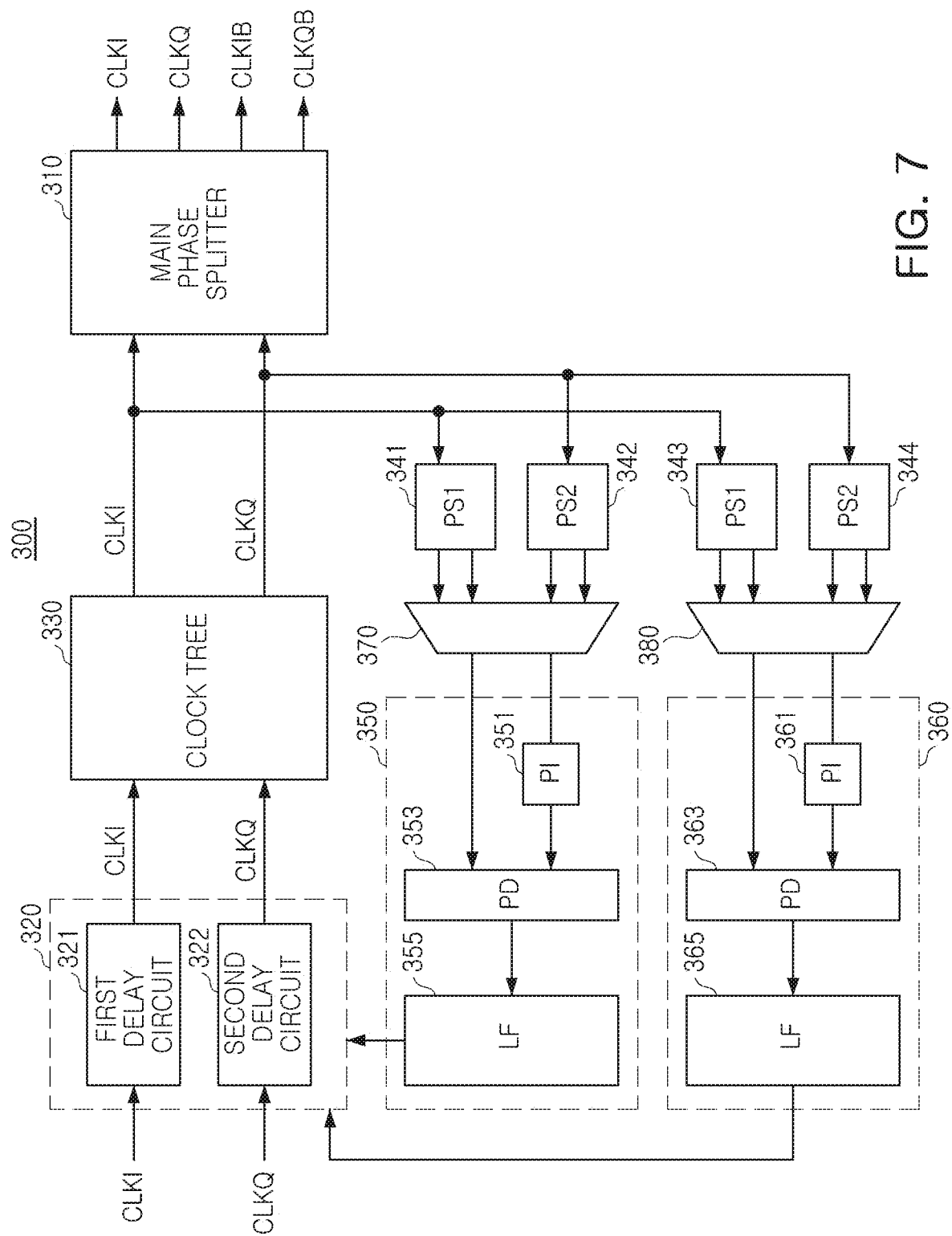
FIG. 7 is a view schematically illustrating a semiconductor device according to some example embodiments.

FIG. 7 is a view schematically illustrating a semiconductor device according to some example embodiments.

Referring to FIG. 7, a semiconductor device 300 according to some example embodiments may include a main phase splitter 310, a delay circuit 320, a clock tree 330, phase splitters 341 to 344, code generators 350 and 360, and multiplexers 370 and 380. The delay circuit 320 may receive a first clock signal CLKI and a second clock signal CLKQ, transmitted by an external host or the like. For example, a first delay circuit 321 may adjust timing of a falling edge of the first clock signal CLKI, and a second delay circuit 322 may adjust timing of a rising edge and timing of a falling edge of the second clock signal CLKQ.

The clock tree 330 may receive the first clock signal CLKI and the second clock signal CLKQ from the delay circuit 320, e.g. from an output terminal thereof, and may transmit the same to the main phase splitter 310 and the phase splitters 341 to 344, e.g. to input terminals thereof. The main phase splitter 310 may receive the first clock signal CLKI and the second clock signal CLKQ, and may output first to fourth clock signals CLKI, CLKQ. CLKIB, and CLKQB. The first to fourth clock signals CLKI, CLKQ. CLKIB, and CLKQB output by the main phase splitter 310 may output a data signal DQ externally, or may be input to a circuit receiving a data signal DQ externally.

The first clock signal CLKI may be input to first phase splitters 341 and 343, and the second clock signal CLKQ may be input to second phase splitters 342 and 344. Each of the first phase splitters 341 and 343 may output a first clock signal CLKI, and a first complementary clock signal that may be a complementary signal of the first clock signal CLKI. Each of the second phase splitters 342 and 344 may output a second clock signal CLKQ, and a second complementary clock signal that may be a complementary signal of the second clock signal CLKQ. Therefore, a first clock signal CLKI, a second clock signal CLKQ, a first complementary clock signal, and a second complementary clock signal may be input to a first multiplexer 370 and a second multiplexer 380, respectively.

Each of the first multiplexer 370 and the second multiplexer 380 may determine a pair of selection clock signals, from among the first clock signal CLKI, the second clock signal CLKQ, the first complementary clock signal, and the second complementary clock signal. A pair of first selection clock signals selected by the first multiplexer 370 may be input to a first code generator 350, and a pair of second selection clock signals selected by the second multiplexer 380 may be input to a second code generator 360.

The first code generator 350 and the second code generator 360 may have similar structures. Each of the first code generator 350 and the second code generator 360 may include phase interpolators 351 and 361, phase detectors 353 and 363, and digital loop filters 355 and 365. Hereinafter, an operation of the first code generator 350 will be described in detail, and an operation of the second code generator 360 may be similar to that of the first code generator 350.

One first selection clock signal among a pair of first selection clock signals output by the first multiplexer 370 may be input to a phase interpolator 351, and the phase interpolator 351 may delay a phase of the one first selection clock signal and output the same. A phase detector 353 may detect a phase difference error of the pair of first selection clock signals, and may transmit the detected phase difference error to a digital loop filter 355. The digital loop filter 355 may output a phase code in response to an output of the phase detector 353. The phase code may have a predetermined number of bits, and the phase code may be input to the first delay circuit 321 or the second delay circuit 322.

An operation similar to the first code generator 350 may be performed simultaneously or at least partially simultaneously in the second code generator 360, and a phase code generated by the first code generator 350 and a phase code generated by the second code generator 360 may be simultaneously input to the delay circuit 320. Based on the phase code generated by the first code generator 350 and the phase code generated by the second code generator 360, the delay circuit 320 may simultaneously or at least partly simultaneously adjust timing of two of a falling edge of the first clock signal CLKI and a falling edge and a rising edge of the second clock signal CLKQ.

Hereinafter, an operation of correcting the phase difference error of the first to fourth clock signals CLKI, CLKQ, CLKIB, and CLKQB during a lock time will be described in more detail with reference to FIG. 8.

Figure 8:
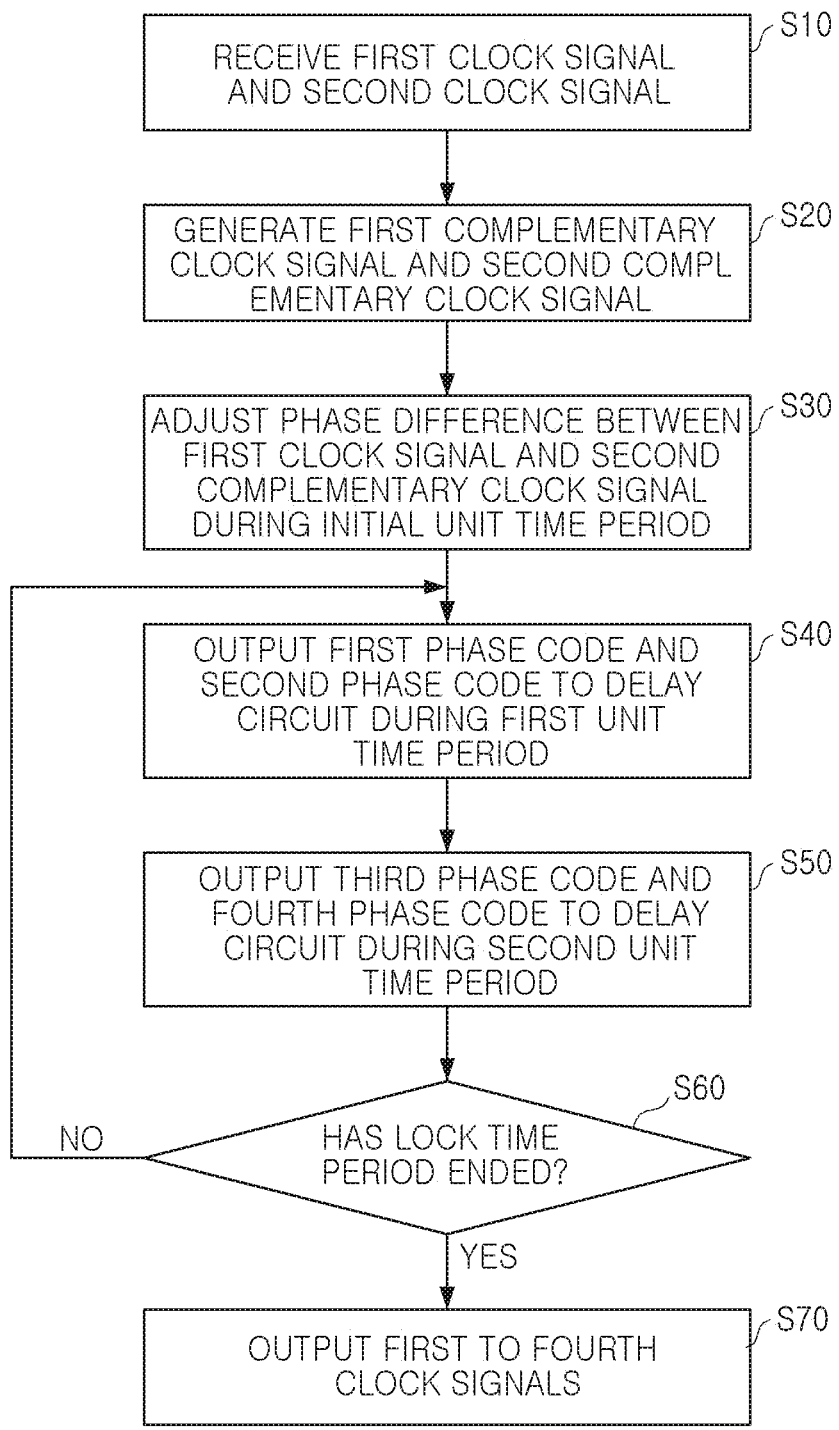
FIG. 8 is a flow chart illustrating an operation of a semiconductor device according to some example embodiments.

FIG. 8 is a flow chart illustrating an operation of a semiconductor device according to some example embodiments.

Hereinafter, for convenience of description, an operation of a semiconductor device 300 will be described, with reference to FIG. 7 together. An operation of generating first to fourth clock signals CLKI, CLKQ. CLKIB, and CLKQB using a first clock signal CLKI and a second clock signal CLKQ, and an operation of correcting a phase difference error of the first to fourth clock signals CLKI, CLKQ. CLKIB, and CLKQB may be performed during a lock time. The lock time may be or be based on a predetermined and/or dynamically determined time period, such as described in a specification of a semiconductor device 300 or the like, and may start with an initial unit time period. After the initial unit time period within the lock time, a first unit time period and a second unit time period may be alternately repeated.

When a lock time starts, a semiconductor device 300 may receive using a first clock signal CLKI and a second clock signal CLKQ (S10). The first clock signal CLKI may be input to first phase splitters 341 and 343, and the second clock signal CLKQ may be input to second phase splitters 342 and 344. Each of the first phase splitters 341 and 343 may generate a first complementary clock signal having a phase difference of 180 degrees with respect to the first clock signal CLKI, and each of the second phase splitters 342 and 344 may generate a second complementary clock signal having a phase difference of 180 degrees with respect to the second clock signal CLKQ (S20). The first clock signal CLKI, the second clock signal CLKQ, the first complementary clock signal, and the second complementary clock signal may be input to a first multiplexer 370 and a second multiplexer 380, respectively.

During an initial unit time period, a delay circuit 320 may adjust a phase difference between the first clock signal CLKI and the second complementary clock signal, by a phase code output by a first code generator 350 (S30). For example, during the initial unit time period, the first multiplexer 370 may select the first clock signal CLKI and the second complementary clock signal as a pair of first selection clock signals, from among the first clock signal CLKI, the second clock signal CLKQ, the first complementary clock signal, and the second complementary clock signal, received from the first phase splitter 341 and the second phase splitter 342.

The second complementary clock signal may be input to a phase interpolator 351, and the phase interpolator 351 may delay a phase of the second complementary clock signal by 90 degrees. Assuming an ideal case in which there is no phase difference error, a phase difference may not be detected in a phase detector 353 as the phase of the second complementary clock signal is delayed by 90 degrees by the phase interpolator 351. Therefore, the phase detector 353 may detect a phase difference error existing between the first clock signal CLKI and the second complementary clock signal, and may transmit the detected phase difference error to a digital loop filter 355.

The digital loop filter 355 may generate a default code, which may be or may correspond to a phase code for correcting a phase difference error between the first clock signal CLKI and the second complementary clock signal, so as to output the same to the delay circuit 320. For example, the default code may be input to a second delay circuit 322, and the second delay circuit 322 may adjust timing of a falling edge of the second clock signal CLKQ with reference to the default code.

During a first unit time period after the initial unit time period, the first code generator 350 may output a first phase code to the delay circuit 320, and a second code generator 360 may output a second phase code to the delay circuit 320 (S40). For example, during the first unit time period, the first multiplexer 370 may output the first clock signal CLKI and the second clock signal CLKQ as a pair of first selection clock signals, and the second multiplexer 380 may output the first complementary clock signal and the second complementary clock signal as a pair of second selection clock signals.

The digital loop filter 355 of the first code generator 350 may output a first phase code for adjusting a phase difference between the first clock signal CLKI and the second clock signal CLKQ. A digital loop filter 365 of the second code generator 360 may output a second phase code for adjusting a phase difference between the first complementary clock signal and the second complementary clock signal. The first phase code and the second phase code may be input to the second delay circuit 322, and the second delay circuit 322 may adjust timing of a rising edge of the second clock signal CLKQ in response to the first phase code, and may adjust timing of a falling edge of the second clock signal CLKQ in response to the second phase code. During the first unit time period, the delay circuit 320 may simultaneously or at least partly adjust timing of each of the rising and falling edges of the second clock signal CLKQ, which may be one of external clock signals.

During a second unit time period, the first code generator 350 may output a third phase code to the delay circuit 320, and the second code generator 360 may output a fourth phase code to the delay circuit 320 (S50). The first multiplexer 370 may output the second clock signal CLKQ and the first complementary clock signal as a pair of first selection clock signals, and the second multiplexer 380 may output the first clock signal CLKI and the second complementary clock signal as a pair of second selection clock signals.

The digital loop filter 355 of the first code generator 350 may output the third phase code for adjusting a phase difference between the second clock signal CLKQ and the first complementary clock signal. The digital loop filter 365 of the second code generator 360 may output the fourth phase code for adjusting a phase difference between the first clock signal CLKI and the second complementary clock signal. The first delay circuit 321 may adjust timing of a falling edge of the first clock signal CLKI in response to the third phase code, and the second delay circuit 322 may adjust timing of a falling edge of the second clock signal CLKQ in response to the fourth phase code. During the second unit time period, the delay circuit 320 may simultaneously adjust timing of a rising edge of the first clock signal CLKI, which may be one of the external clock signals, and timing of a falling edge of the second clock signal CLKQ, which may be the other of the external clock signals.

After the second unit time period, the semiconductor device 300 may determine whether the lock time has ended (S60). When the semiconductor device 300 determines that the lock time has not yet ended in S60, the semiconductor device 300 may adjust timing of each of the falling edge of the first clock signal CLKI, and the rising edge and the falling edge of the second clock signal CLKQ. Since timing of two of the falling edge of the first clock signal CLKI, and the rising edge and the falling edge of the second clock signal CLKQ may be simultaneously adjusted in each of the first unit time period and the second unit time period, a lock time may be shortened and/or a phase difference error may be corrected more accurately within a determined lock time.

When the semiconductor device 300 determines that the lock time has ended in S60, the semiconductor device 300 may output the first to fourth clock signals CLKI, CLKQ. CLKIB, and CLKQB (S70). For example, after the lock time ends, a main phase splitter 310 may receive the first clock signal CLKI, may output the third clock signal CLKIB having a phase difference of 180 degrees from the first clock signal CLKI, and may receive the second clock signal CLKQ, to output the second clock signal CLKQ and the fourth clock signal CLKQB having a phase difference of 180 degrees from the second clock signal CLKQ.

The main phase splitter 310 may output the third clock signal CLKIB having a rising edge at the same timing as a falling edge of the first clock signal CLKI, and the fourth clock signal CLKQB having a rising edge at the same timing as a falling edge of the second clock signal CLKQ. Since timing of the falling edge of the first clock signal CLKI and the rising and falling edges of the second clock signal CLKQ may be adjusted within the lock time, a phase difference error between the first to fourth clock signals CLKI, CLKQ. CLKIB, and CLKQB output by the main phase splitter 310 may be minimized after the lock time.

As described above, in various example embodiments, the timing of two of the falling edge of the first clock signal CLKI, and the rising edge and the falling edge of the second clock signal CLKQ may be simultaneously adjusted in each of the first unit time period and the second unit time period. Therefore, it may be possible to increase the number of times to adjust timing of the falling edge of the first clock signal CLKI and the rising edge and the falling edge of the second clock signal CLKQ within a limited lock time, and as a result, phase difference errors between the first to fourth clock signals CLKI, CLKQ. CLKIB, and CLKQB may be more effectively reduced.

Figure 9:
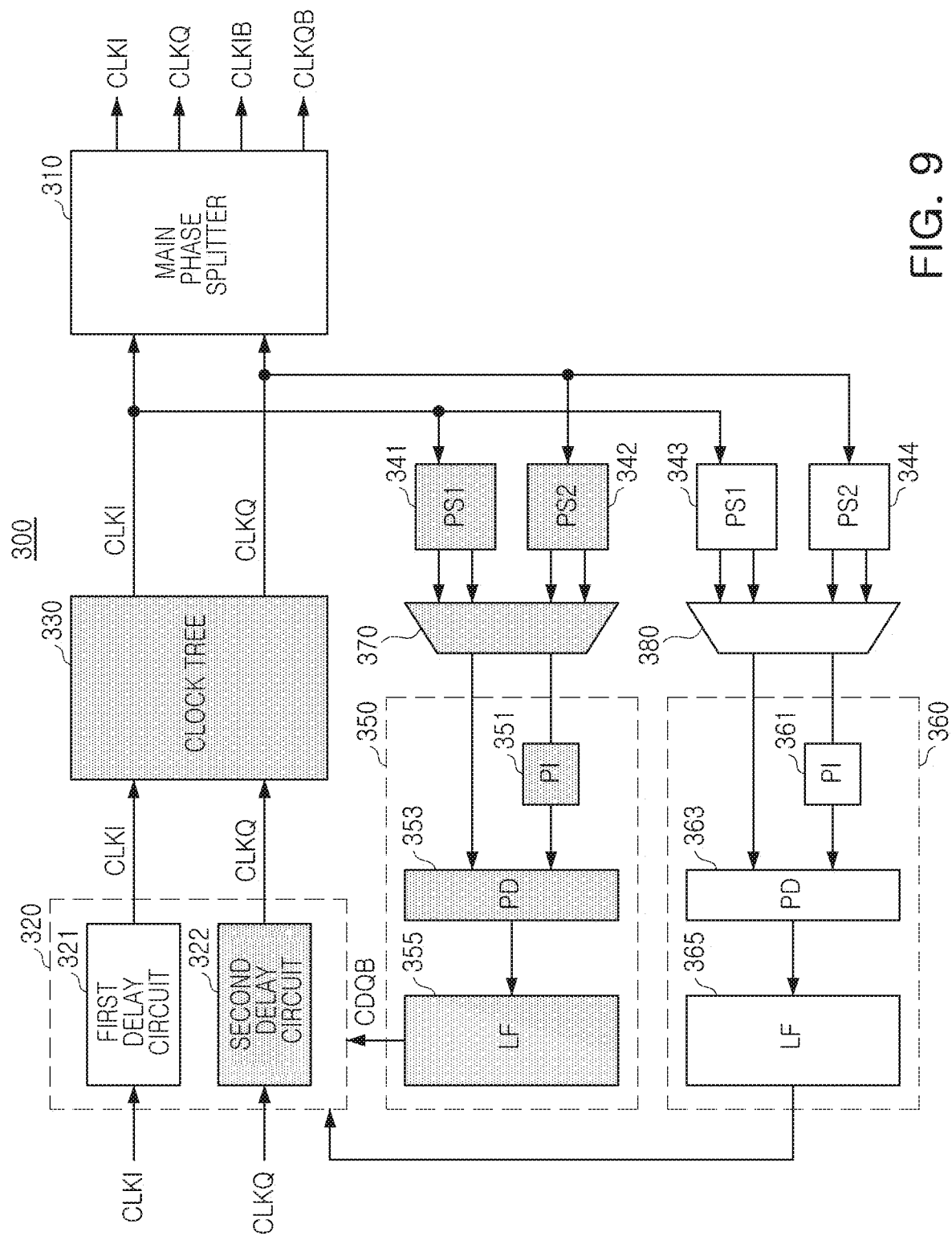
FIGS. 9 to 11 are views illustrating an operation of a semiconductor device according to some example embodiments.
Figure 10:
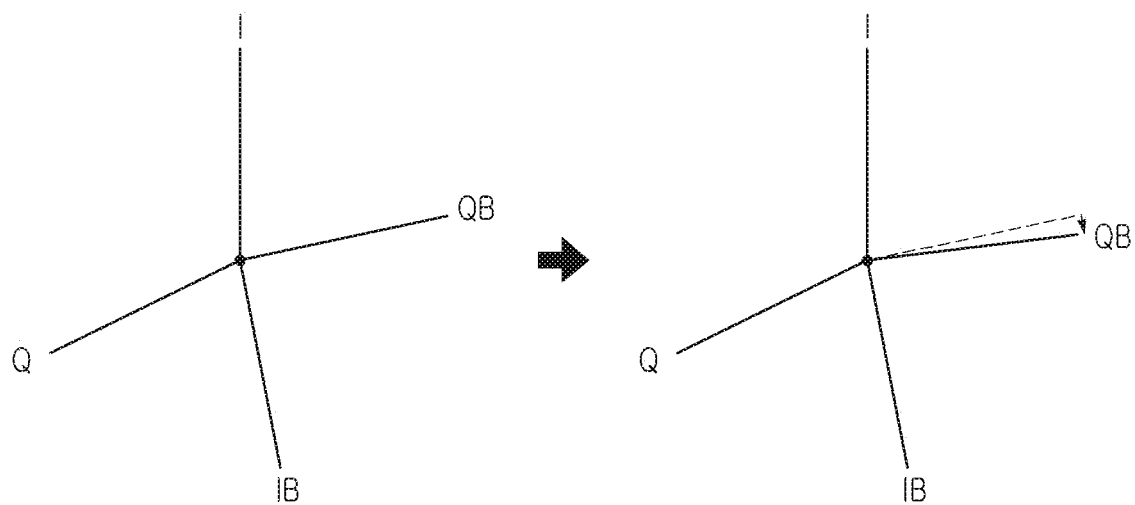
Figure 11:
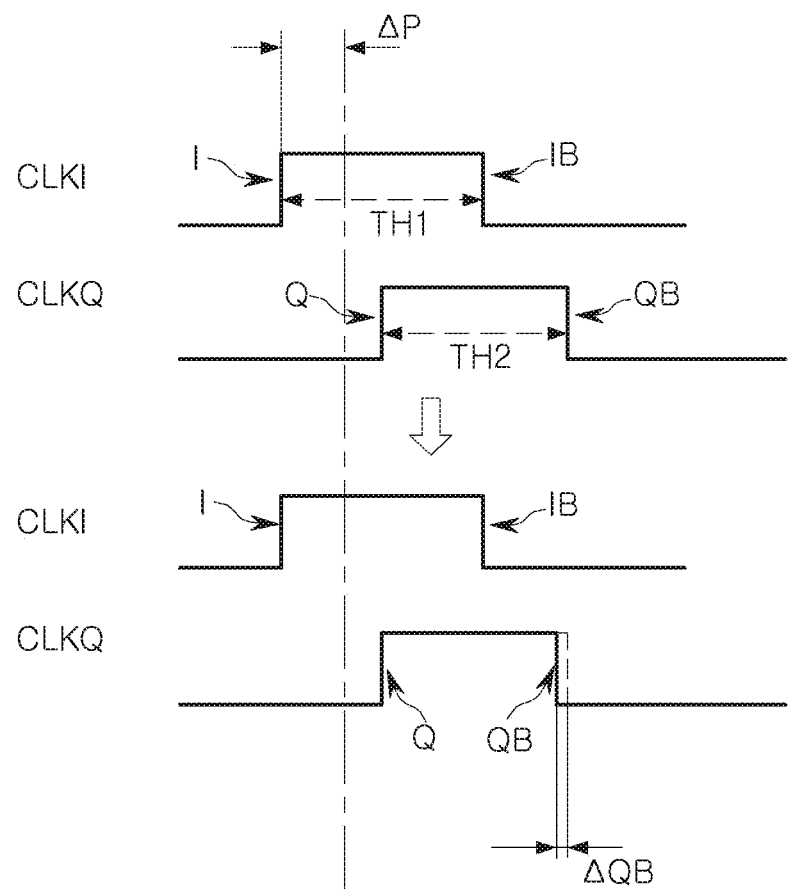

FIGS. 9 to 11 are views illustrating an operation of a semiconductor device according to various example embodiments.

FIGS. 9 to 11 may be views illustrating an operation of a semiconductor device 300 during an initial unit time period of a lock time. During the initial unit time period, a first phase splitter 341 may provide a first clock signal CLKI and a first complementary clock signal, which may be a complementary signal of the first clock signal CLKI, to a first multiplexer 370, and a second phase splitter 342 may provide a second clock signal CLKQ and a second complementary clock signal, which may be a complementary signal of the second clock signal CLKQ, to the first multiplexer 370. The first multiplexer 370 may select and provide the first clock signal CLKI and the second complementary clock signal, to a first code generator 350.

At a start point of the initial unit time period, a phase difference error may exist in at least a portion of a falling edge of the first clock signal CLKI, or a rising edge or a falling edge of the second clock signal CLKQ. For example, assuming that there is no phase difference error, an initial phase difference ΔP between the rising edge of the first clock signal CLKI and the second clock signal CLKQ may correspond to 90 degrees. Referring to FIGS. 10 and 11 (which may exaggerate phase differences for illustrative purposes), a phase difference between a rising edge I of the first clock signal CLKI and a rising edge Q of the second clock signal CLKQ may be greater than the initial phase difference ΔP due to a phase difference error. A phase difference between the rising edge I of the first clock signal CLKI and a falling edge IB of the first clock signal CLKI may be greater than 180 degrees. In addition, a phase difference between the rising edge I of the first clock signal CLKI and a falling edge QB of the second clock signal CLKQ may be greater than 270 degrees.

In addition, due to a phase difference error between the rising edge I and the falling edge IB of the first clock signal CLKI, a time period TH1 of the first clock signal CLKI having a high logic level (e.g. a '1') may be longer than a reference time period corresponding to a duty ratio of 50%. due to a phase difference error between the rising edge Q and the falling edge QB of the second clock signal CLKQ, a time period TH2 of the second clock signal CLKQ having a high logic level may be shorter than the reference time period corresponding to the duty ratio of 50%.

A phase interpolator 351 of the first code generator 350 may delay and output the second complementary clock signal by 90 degrees, and a phase detector 353 may detect a phase difference error between a rising edge of the second complementary clock signal delayed by 90 degrees and the rising edge I of the first clock signal CLKI. For example, the rising edge of the second complementary clock signal delayed by 90 degrees may appear at the same timing as the falling edge QB of the second clock signal CLKQ illustrated in FIG. 11.

A digital loop filter 355 may generate a default code CDQB, based on the phase difference error detected by the phase detector 353, and the default code CDQB may be input to a second delay circuit 322. The second delay circuit 322 may adjust timing of the falling edge QB of the second clock signal CLKQ with reference to the default code CDQB, as illustrated in FIG. 11. In various example embodiments described with reference to FIGS. 9 to 11, the phase difference between the rising edge I of the first clock signal CLKI and the falling edge QB of the second clock signal CLKQ may be greater than 270 degrees due to a phase difference error. Therefore, the second delay circuit 322 may advance the timing of the falling edge QB of the second clock signal CLKQ by a delay amount ΔQB corresponding to the default code CDQB.

Figure 12:
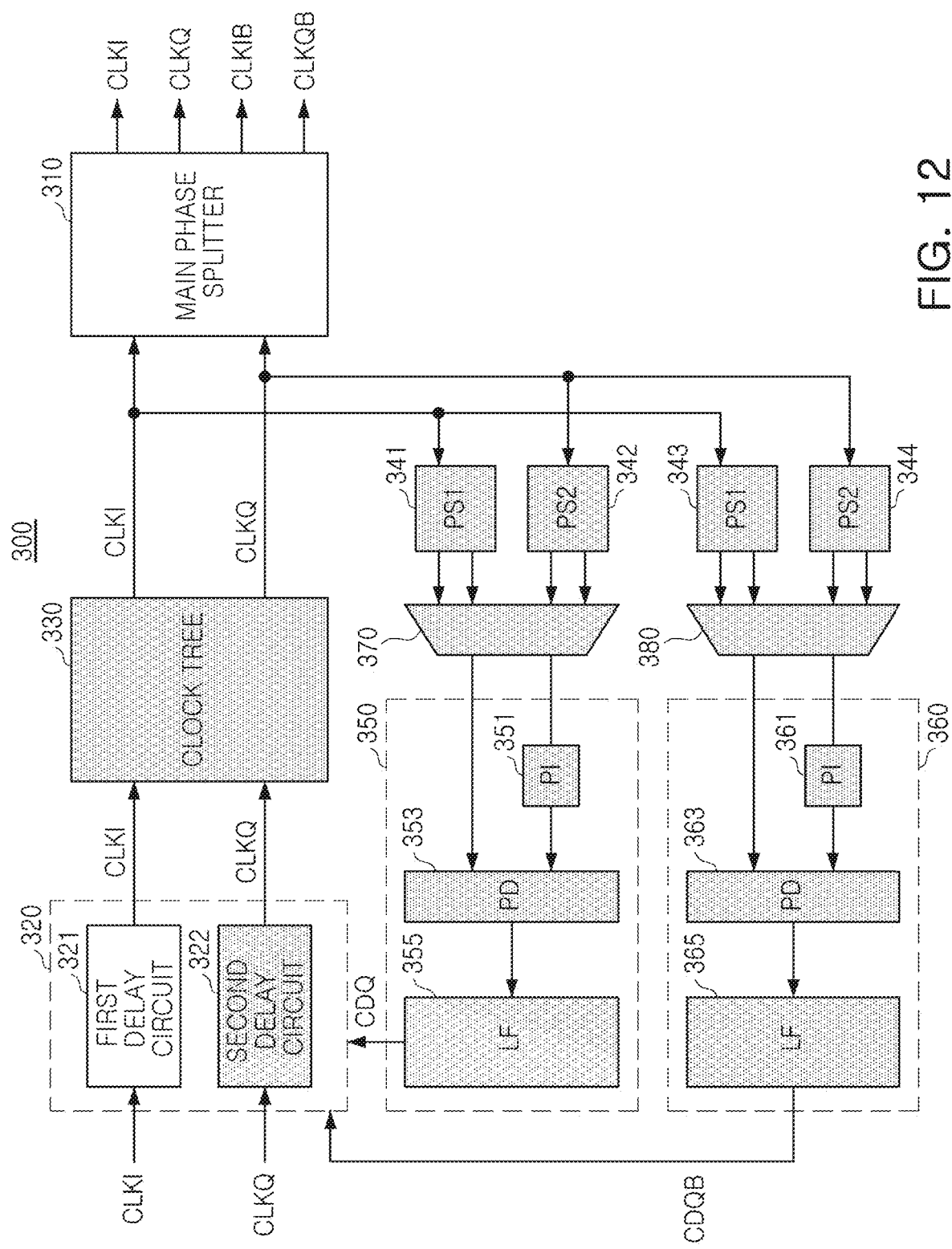
FIGS. 12 to 14 are views illustrating an operation of a semiconductor device according to some example embodiments.
Figure 13:
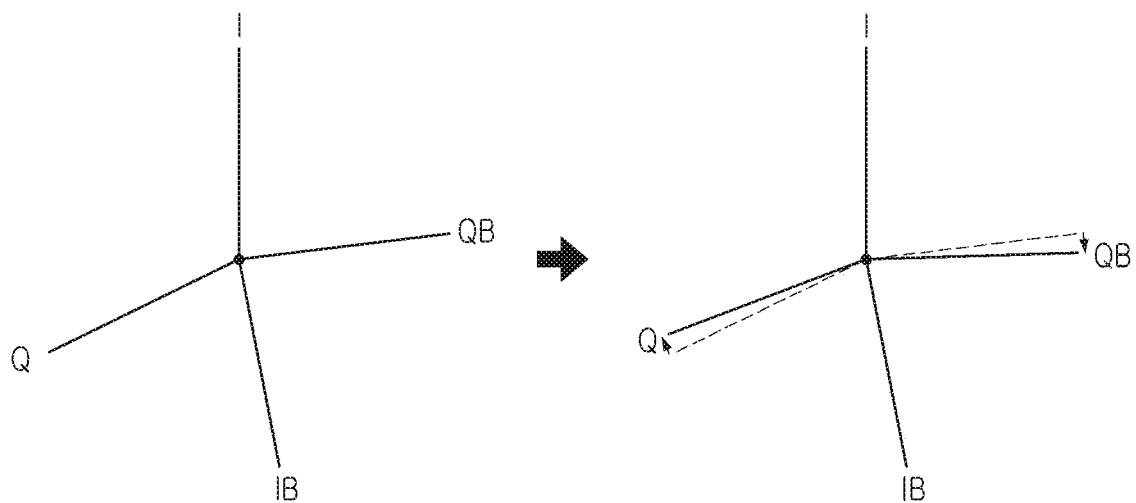
Figure 14:
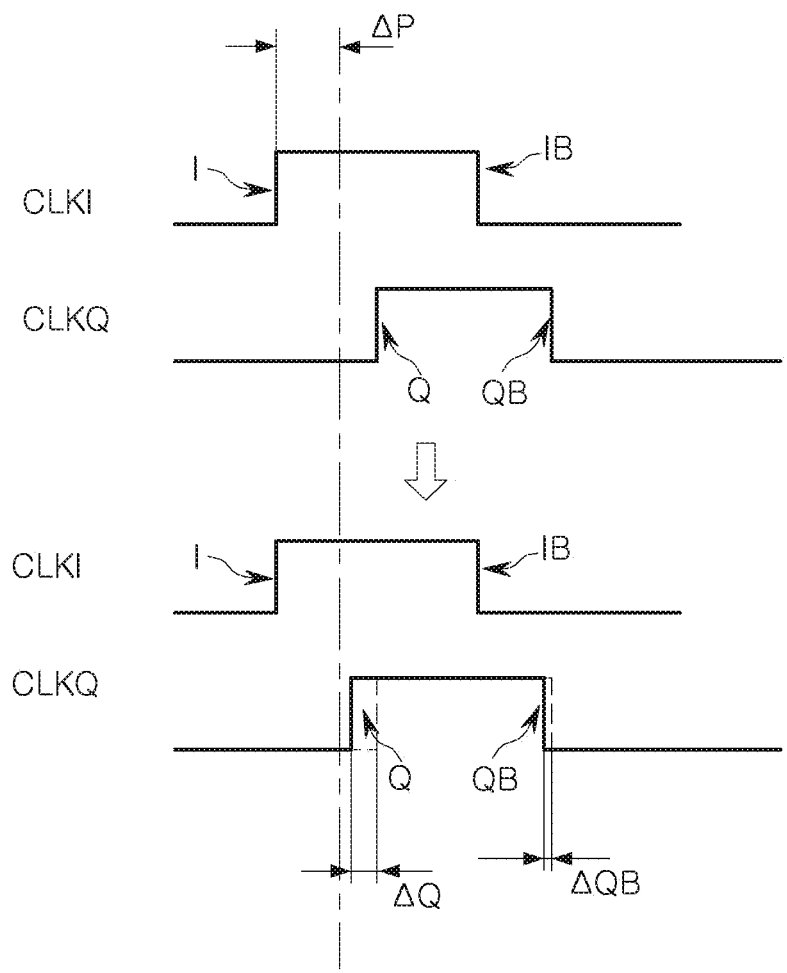

FIGS. 12 to 14 are views illustrating an operation of a semiconductor device according to some example embodiments.

FIGS. 12 to 14 may be views illustrating an operation of a semiconductor device 300 during a first unit time period of a lock time. During the first unit time period, first phase splitters 341 and 343 may output a first clock signal CLKI and a first complementary clock signal, which may be a complementary signal of the first clock signal CLKI, and second phase splitters 342 and 344 may output a second clock signal CLKQ and a second complementary clock signal, which may be a complementary signal of the second clock signal CLKQ. The first clock signal CLKI, the second clock signal CLKQ, the first complementary clock signal, and the second complementary clock signal may be input to a first multiplexer 370 and a second multiplexer 380.

Each of the first multiplexer 370 and the second multiplexer 380 may select and provide two of the first clock signal CLKI, the second clock signal CLKQ, the first complementary clock signal, and the second complementary clock signal, to a first code generator 350 and a second code generator 360. For example, during the first unit time period, the first multiplexer 370 may select and provide the first clock signal CLKI and the second clock signal CLKQ, to the first code generator 350. In addition, during the first unit time period, the second multiplexer 380 may select and provide the first complementary clock signal and the second complementary clock signal, to the second code generator 360. For example, each of the first multiplexer 370 and the second multiplexer 380 may select two clock signals having a phase difference of 90 degrees or about 90 degrees from the first clock signal CLKI, the second clock signal CLKQ, the first complementary clock signal, and the second complementary clock signal.

Phase interpolators 351 and 361 may adjust a phase of one of two clock signals having a phase difference of 90 degrees, by 90 degrees, respectively. For example, the phase interpolator 351 of the first code generator 350 may delay a phase of the first clock signal CLKI by 90 degrees, and output the same. Similarly, the phase interpolator 361 of the second code generator 360 may delay a phase of the first complementary clock signal by 90 degrees, and output the same. Phase detectors 353 and 363 may output a phase difference error of two clock signals to be input, respectively, and digital loop filters 355 and 365 may output phase codes CDQ and CDQB, respectively, for correcting the phase difference error.

For example, the first code generator 350 may output a first phase code CDQ, and the second code generator 360 may output a second phase code CDQB. The first phase code CDQ may be or may correspond to a code for correcting a phase difference error between the first clock signal CLKI and the second clock signal CLKQ, delayed by 90 degrees. A second delay circuit 322 receiving the first phase code CDQ may advance timing of a rising edge Q of the second clock signal CLKQ by a first control amount ΔQ, as illustrated in FIGS. 13 and 14. Therefore, a phase difference between a rising edge I of the first clock signal CLKI and the rising edge Q of the second clock signal CLKQ may be adjusted to be close to 90 degrees.

The second phase code CDQB may be or may correspond to a code for correcting a phase difference error between the first complementary clock signal and the second complementary clock signal, delayed by 90 degrees. The second delay circuit 322 receiving the second phase code CDQB may advance timing of a falling edge QB of the second clock signal CLKQ by a second control amount ΔQB, as illustrated in FIGS. 13 and 14. Therefore, a phase difference between a falling edge IB of the first clock signal CLKI and the falling edge QB of the second clock signal CLKQ may be adjusted to be close to 90 degrees. Since the second delay circuit 322 individually adjusts timing of each of the rising edge Q and the falling edge QB of the second clock signal CLKQ during the first unit time period, only the second delay circuit 322 may operate during the first unit time period.

According to some example embodiments, the second phase code CDQB may be input to a first delay circuit 321. In this case, the first delay circuit 321 may adjust timing of a falling edge IB of the first clock signal CLKI with reference to the second phase code CDQB.

Figure 15:
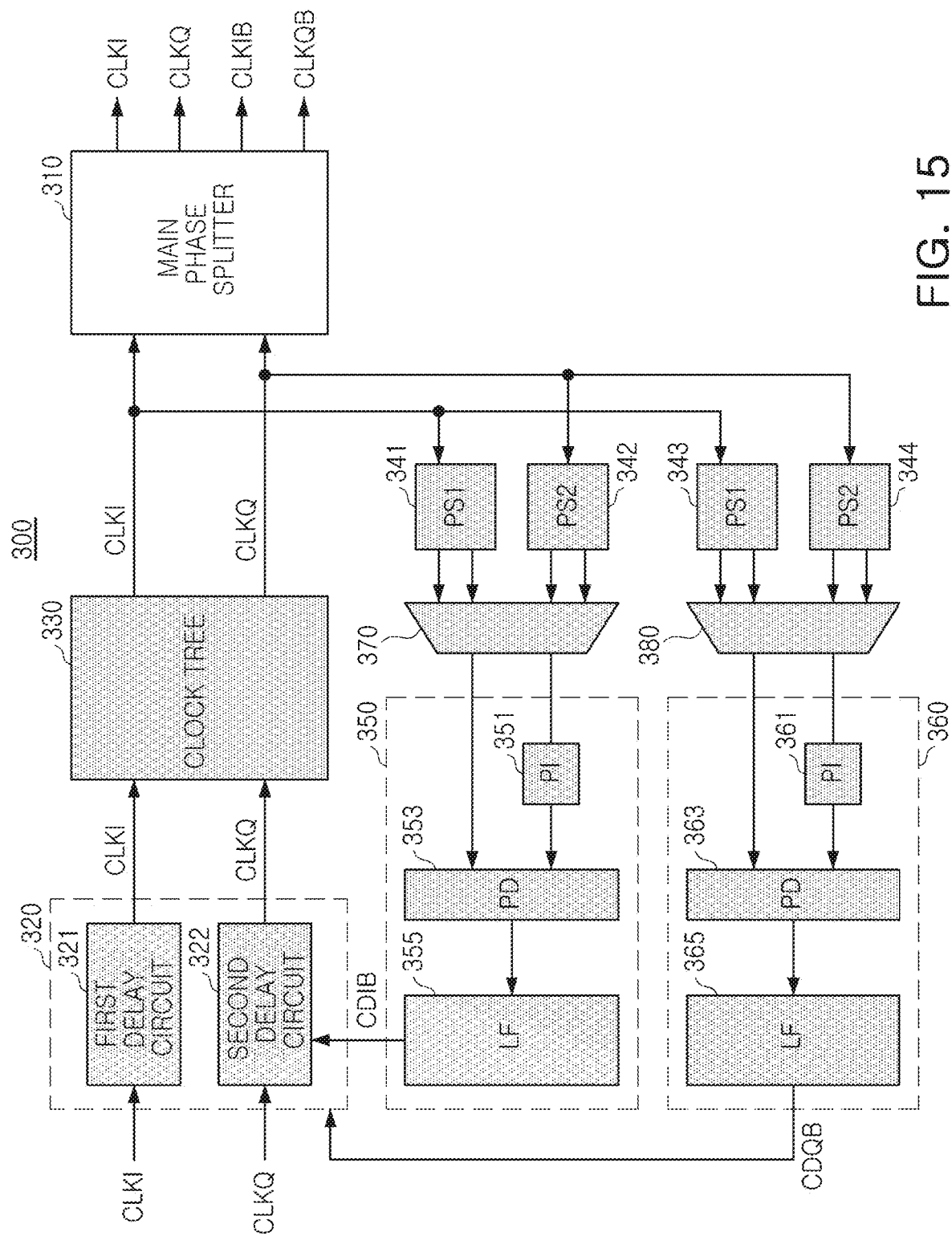
FIGS. 15 to 17 are views illustrating an operation of a semiconductor device according to some example embodiments.
Figure 16:
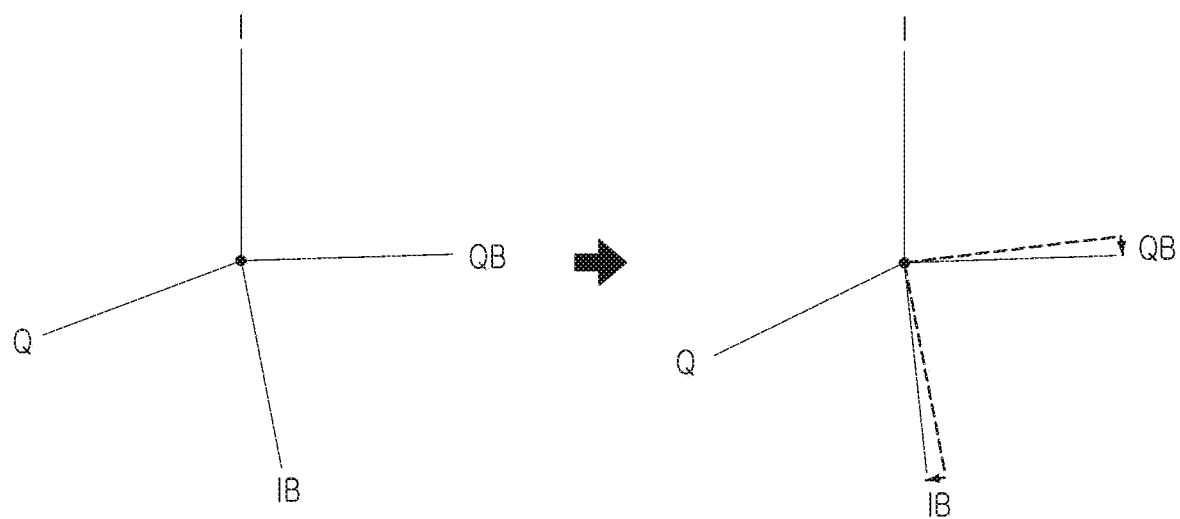
Figure 17:
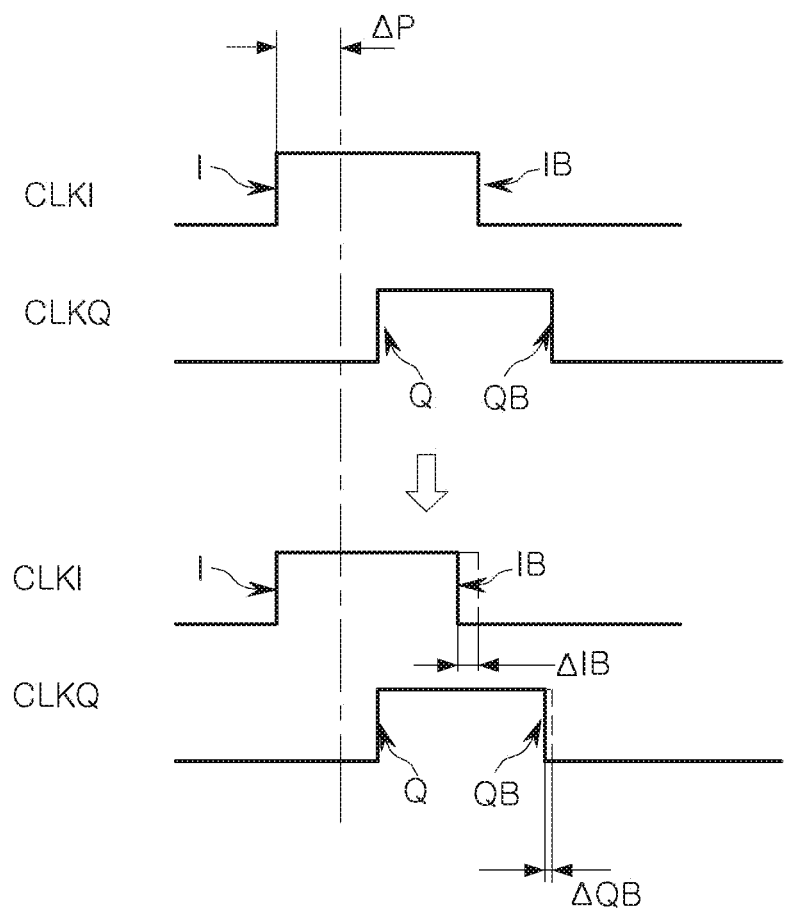

FIGS. 15 to 17 are views illustrating an operation of a semiconductor device according to some example embodiments.

FIGS. 15 to 17 may be views illustrating an operation of a semiconductor device 300 during a second unit time period of a lock time. During the second unit time period, first phase splitters 341 and 343 may output a first clock signal CLKI and a first complementary clock signal, which may be a complementary signal of the first clock signal CLKI, and second phase splitters 342 and 344 may output a second clock signal CLKQ and a second complementary clock signal, which may be a complementary signal of the second clock signal CLKQ. The first clock signal CLKI, the second clock signal CLKQ, the first complementary clock signal, and the second complementary clock signal may be input to a first multiplexer 370 and a second multiplexer 380.

Each of the first multiplexer 370 and the second multiplexer 380 may select and provide two of the first clock signal CLKI, the second clock signal CLKQ, the first complementary clock signal, and the second complementary clock signal, to a first code generator 350 and a second code generator 360. For example, during the second unit time period, the first multiplexer 370 may select and provide the second clock signal CLKQ and the first complementary clock signal, to the first code generator 350. In addition, during the second unit time period, the second multiplexer 380 may select and provide the first clock signal CLKI and the second complementary clock signal, to the second code generator 360. Each of the first multiplexer 370 and the second multiplexer 380 may select two clock signals having a phase difference of 90 degrees from the first clock signal CLKI, the second clock signal CLKQ, the first complementary clock signal, and the second complementary clock signal.

Phase interpolators 351 and 361 may adjust a phase of one of two clock signals by 90 degrees, respectively. For example, the phase interpolator 351 of the first code generator 350 may delay a phase of the second clock signal CLKQ by 90 degrees, and output the same. Similarly, the phase interpolator 361 of the second code generator 360 may delay a phase of the second complementary clock signal by 90 degrees, and output the same. Phase detectors 353 and 363 may output a phase difference error of two clock signals to be input, respectively, and digital loop filters 355 and 365 may output phase codes CDIB and CDQB, respectively, for correcting the phase difference error.

For example, the first code generator 350 may output a third phase code CDIB, and the second code generator 360 may output a fourth phase code CDQB. The third phase code CDIB may be a code for correcting a phase difference error between the second clock signal CLKQ and the first complementary clock signal, delayed by 90 degrees. A first delay circuit 322 receiving the third phase code CDIB may advance timing of a falling edge IB of the first clock signal CLKI by a third control amount ΔIB, as illustrated in FIGS. 16 and 17. Therefore, a phase difference between a rising edge Q of the second clock signal CLKQ and the falling edge IB of the first clock signal CLKI may be adjusted to be close to 90 degrees.

The fourth phase code CDQB may be a code for correcting a phase difference error between the second complementary clock signal and the first clock signal CLKI, delayed by 90 degrees. A second delay circuit 322 receiving the fourth phase code CDQB may advance timing of a falling edge QB of the second clock signal CLKQ by a fourth control amount ΔQB, as illustrated in FIGS. 16 and 17. Therefore, a phase difference between the falling edge IB of the first clock signal CLKI and the falling edge QB of the second clock signal CLKQ may be adjusted to be close to 90 degrees. Therefore, during the second unit time period, the first delay circuit 321 may adjust timing of the falling edge IB of the first clock signal CLKI, and the second delay circuit 322 may adjust timing of the falling edge QB of the second clock signal CLKQ.

According to various example embodiments, the third phase code CDIB may be input to the second delay circuit 322. In this case, the second delay circuit 322 may adjust timing of the rising edge Q of the second clock signal CLKQ with reference to the third phase code CDIB. When the third phase code CDIB is input to the second delay circuit 322 during the second unit time period, a second phase code CDQB generated during a first unit time period may be input to the first delay circuit 321.

Figure 18:
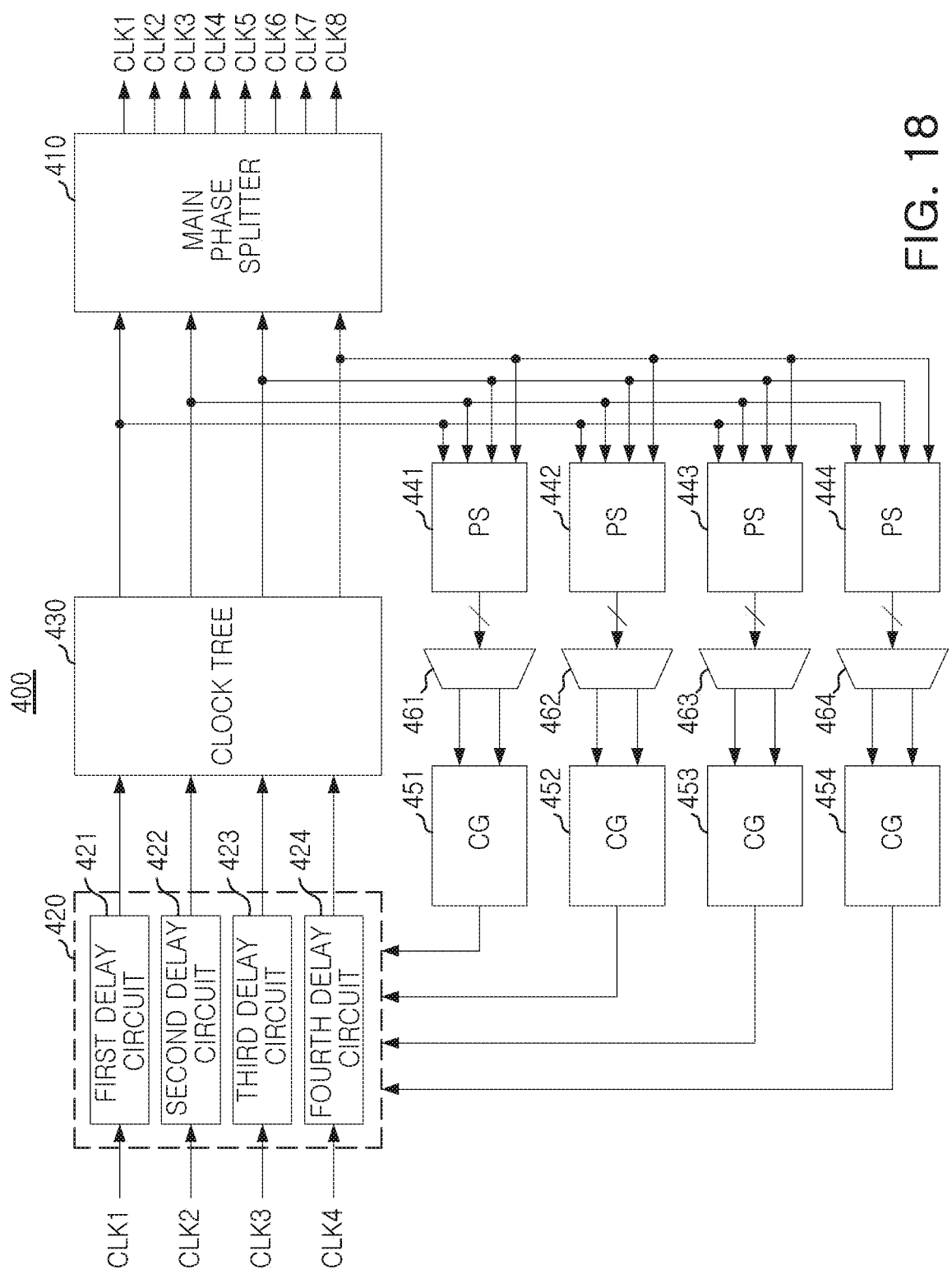
FIG. 18 is a view schematically illustrating a semiconductor device according to some example embodiments.

FIG. 18 is a view schematically illustrating a semiconductor device according to some example embodiments.

Referring to FIG. 18, a semiconductor device 400 according to some example embodiments may include a main phase splitter 410, a delay circuit 420, a clock tree 430, phase splitters 441 to 444, code generators 451 to 454, and multiplexers 461 to 464. In some example embodiments illustrated in FIG. 18, the delay circuit 420 may receive first to fourth clock signals CLK1 to CLK4 transmitted by an external host or the like.

The first to fourth clock signals CLK1 to CLK4 may have different phases. For example, based on the first clock signal CLK1, the second clock signal CLK2 may have a phase that may be 45 degrees late, and the third clock signal CLK3 may have a phase that may be 90 degrees late. Based on the first clock signal CLK1, the fourth clock signal CLK4 may have a phase 135 degrees late. Therefore, assuming an ideal case in which there is no phase difference error, the first to fourth clock signals CLK1 to CLK4 may have a phase difference of 45 degrees.

A first delay circuit 421 may adjust timing of a falling edge of the first clock signal CLK1, and a second delay circuit 422 may adjust timing of a rising edge and timing of a falling edge of the second clock signal CLK2. A third delay circuit 423 may adjust timing of a rising edge and timing of a falling edge of the third clock signal CLK3, and a fourth delay circuit 424 may adjust timing of a rising edge and timing of a falling edge of the fourth clock signal CLK4.

The clock tree 430 may receive the first to fourth clock signals CLK1 to CLK4 from the delay circuit 420, and transmit the received first to fourth clock signals CLK1 to CLK4 to the main phase splitter 410 and the phase splitters 441 to 444. The main phase splitter 410 may receive the first to fourth clock signals CLK1 to CLK4 and output first to eighth clock signals CLK1 to CLK8. The first to eighth clock signals CLK1 to CLK8 output by the main phase splitter 410 may be input to a circuit that outputs the data signal DQ externally or receives the data signal DQ externally. The fifth clock signal CLK5 may be a signal having a phase difference of 180 degrees from the first clock signal CLK1, and the sixth clock signal CLK6 may be a signal having a phase difference of 180 degrees from the second clock signal CLK2. The seventh clock signal CLK7 may be a signal having a phase difference of 180 degrees from the third clock signal CLK3, and the eighth clock signal CLK8 may be a signal having a phase difference of 180 degrees from the fourth clock signal CLK4.

Each of the phase splitters 441 to 444 may receive the first to fourth clock signals CLK1 to CLK4. Each of the phase splitters 441 to 444 may generate a first complementary clock signal of the first clock signal CLK1, a second complementary clock signal of the second clock signal CLK2, a third complementary clock signal of the third clock signal CLK3, and a fourth complementary clock signal of the fourth clock signal CLK4. Each of the phase splitters 441 to 444 may output the first to fourth clock signals CLK1 to CLK4 and the first to fourth complementary clock signals to each of the multiplexers 461 to 464.

Each of the multiplexers 461 to 464 may determine a pair of selection clock signals, among the first to fourth clock signals CLK1 to CLK4 and the first to fourth complementary clock signals. For example, a first multiplexer 461 may output a pair of first selection clock signals to a first code generator 451, a second multiplexer 462 may output a pair of second selection clock signals to a second code generator 452, and a third multiplexer 463 may output a pair of third selection clock signals to a third code generator 453. A fourth multiplexer 464 may output a pair of fourth selection clock signals to a fourth code generator 454.

A structure of each of the code generators 451 to 454 may be similar to that described above with reference to FIG. 7. For example, each of the code generators 451 to 454 may include a phase interpolator that delays a phase of one of a pair of selected clock signals, a phase detector that outputs a phase difference error, and a digital loop filter that generates a phase code corresponding to the phase difference error output by the phase detector.

In some example embodiments illustrated in FIG. 18, timing of four of a falling edge of the first clock signal CLK1 and a rising edge and a falling edge of each of the second to fourth clock signals CLK2 to CLK4 in the delay circuit 420 may be simultaneously adjusted by four phase codes output by the code generators 451 to 454. Therefore, a lock time may be shortened, or phase difference errors of the first to eighth clock signals CLK1 to CLK8 may be effectively removed within a predetermined lock time.

Hereinafter, an operation of correcting a phase difference error of the first to eighth clock signals CLK1 to CLK8 during a lock time will be described in more detail with reference to FIG. 19 together.

Figure 19:
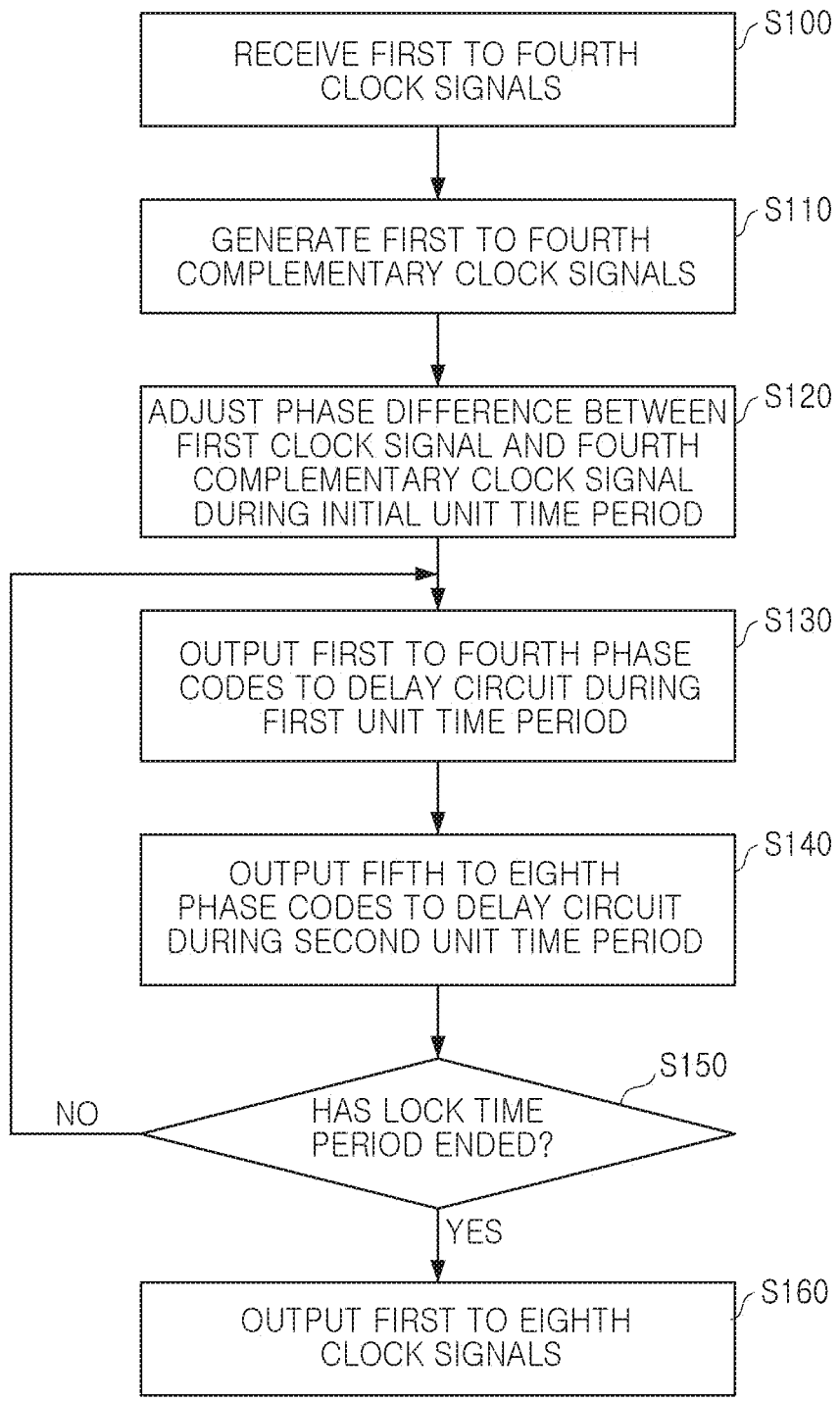
FIG. 19 is a flow chart illustrating an operation of a semiconductor device according to some example embodiments.

FIG. 19 is a flow chart illustrating an operation of a semiconductor device according to some example embodiments.

Hereinafter, for convenience of description, an operation of a semiconductor device 400 will be described with reference to FIG. 18 together. An operation of generating first to eighth clock signals CLK1 to CLK8 using first to fourth clock signals CLK1 to CLK4 and an operation of correcting a phase difference error of the first to eighth clock signals CLK1 to CLK8 may be performed during a lock time. The lock time may be a predetermined time period for a specification of a semiconductor device 400 or the like, and may start with an initial unit time period. After the initial unit time period within the lock time, a first unit time period and a second unit time period may be alternately repeated.

When a lock time starts, a semiconductor device 400 may receive first to fourth clock signals CLK1 to CLK4 from an external host or the like (S100). Each of the first to fourth clock signals CLK1 to CLK4 may be input to phase splitters 441 to 444. Each of the phase splitters 441 to 444 may generate a first complementary clock signal having a phase difference of 180 degrees with regard to the first clock signal CLK1, a second complementary clock signal having a phase difference of 180 degrees with regard to the second clock signal CLK2, a third complementary clock signal having a phase difference of 180 degrees with regard to the third clock signal CLK3, and a fourth complementary clock signal having a phase difference of 180 degrees with regard to the fourth clock signal CLK4 (S110).

During an initial unit time period, a fourth delay circuit 424 may adjust a phase difference between the first clock signal CLK1 and the fourth complementary clock signal by a phase code output by a first code generator 451 (S120). For example, during the initial unit time period, a first multiplexer 461 may select the first clock signal CLK1 and the fourth complementary clock signal, among the first to fourth clock signals CLK1 to CLK4 and the first to fourth complementary clock signals, as a pair of first selection clock signals.

For example, the fourth complementary clock signal may be input to a phase interpolator of the first code generator 451, to delay a phase by 90 degrees. Assuming an ideal case in which there is no phase difference error at all, there may be no phase difference between the fourth complementary clock signal and the first clock signal CLK1 of which phase is delayed by 90 degrees by the phase interpolator. Therefore, a phase detector of the first code generator 451 may detect a phase difference error existing between the first clock signal CLK1 and the fourth complementary clock signal.

A digital loop filter of the first code generator 451 may generate a default code, which may be a phase code for correcting a phase difference error between the first clock signal CLK1 and the fourth complementary clock signal, to output the same to a delay circuit 420. For example, the default code may be input to the fourth delay circuit 424, and the fourth delay circuit 424 may adjust timing of a falling edge of the fourth clock signal CLK4 with reference to the default code.

During a first unit time period after the initial unit time period, code generators 451 to 454 may output first to fourth phase codes to the delay circuit 420 (S130). For example, a first phase code output by the first code generator 451 may be input to a second delay circuit 422, and a second phase code output by a second code generator 452 may be input to the fourth delay circuit 424. A third phase code output by a third code generator 453 may be input to the second delay circuit 422, and a fourth phase code output by a fourth code generator 454 may be input to the fourth delay circuit 424.

For example, during the first unit time period, the first multiplexer 461 may output the first clock signal CLK1 and the second clock signal CLK2 as first selection clock signals, and a second multiplexer 462 may output the third clock signal CLK3 and the fourth clock signal CLK4 as second selection clock signals. A third multiplexer 463 may output the first complementary clock signal and the second complementary clock signal as third selection clock signals, and a fourth multiplexer 464 may output the third complementary clock signal and the fourth complementary clock signal as fourth selection clock signals.

The first code generator 451 may output a first phase code for adjusting a phase difference between the first clock signal CLK1 and the second clock signal CLK2. The second delay circuit 422 may advance or delay timing of a rising edge of the second clock signal CLK2 with reference to the first phase code. The second code generator 452 may output a second phase code for adjusting a phase difference between the third clock signal CLK3 and the fourth clock signal CLK4. The fourth delay circuit 424 may adjust timing of a rising edge of the fourth clock signal CLK4 in response to the second phase code.

The third code generator 453 may output a third phase code for adjusting a phase difference between the first complementary clock signal and the second complementary clock signal. The second delay circuit 422 may adjust timing of a falling edge of the second clock signal CLK2 with reference to the third phase code. The fourth code generator 454 may output a fourth phase code for adjusting a phase difference between the third complementary clock signal and the fourth complementary clock signal. The fourth delay circuit 424 may adjust timing of a falling edge of the fourth clock signal CLK4 in response to the fourth phase code.

During a second unit time period, the code generators 451 to 454 may output fifth to eighth phase codes to the delay circuit 420 (S140). For example, the first code generator 451 may output a fifth phase code to the third delay circuit 423, and the second code generator 452 may output a sixth phase code to the first delay circuit 421. The third code generator 453 may output a seventh phase code to the third delay circuit 423, and the fourth code generator 454 may output an eighth delay code to the fourth delay circuit 424. Therefore, in some example embodiments, the number of circuits actually operating among the first to fourth delay circuits 421 to 424 during the first unit time period may be different from the number of circuits actually operating among the first to fourth delay circuits 421 to 424 during the second unit time period.

For example, during the second unit time period, the first multiplexer 461 may output the second clock signal CLK2 and the third clock signal CLK3 as first selection clock signals, and the first code generator 451 may output a fifth phase code corresponding to a phase difference error between the second clock signal CLK2 and the third clock signal CLK3. The third delay circuit 423 may adjust timing of a rising edge of the third clock signal CLK3 in response to the fifth phase code. The second multiplexer 462 may output the fourth clock signal CLK4 and the first complementary clock signal as second selection clock signals, and the second code generator 452 may output a sixth phase code corresponding to a phase difference error between the fourth clock signal CLK4 and the first complementary clock signal. The first delay circuit 421 may adjust timing of a falling edge of the first clock signal CLK1 in response to the sixth phase code.

During the second unit time period, the third multiplexer 463 may output the second complementary clock signal and the third complementary clock signal as third selection clock signals, and the third code generator 453 may output a seventh phase code corresponding to a phase difference error between the second complementary clock signal and the third complementary clock signal. The third delay circuit 423 may adjust timing of a falling edge of the third clock signal CLK3 in response to the seventh phase code. The fourth multiplexer 464 may output the fourth complementary clock signal and the first clock signal CLK1 as fourth selection clock signals, and the fourth code generator 454 may output an eighth phase code corresponding to a phase difference error between the fourth complementary clock signal and the first clock signal CLK1. The fourth delay circuit 424 may adjust timing of a falling edge of the fourth clock signal CLK4 with reference to the eighth phase code.

After the second unit time period, the semiconductor device 400 may determine whether the lock time has ended (S150). When it is determined that the lock time has not yet ended in S150, the semiconductor device 400 may adjust timing of a falling edge of the first clock signal CLK1, and rising and falling edges of each of the second to fourth clock signals CLK2 to CLK4. Since timing of four of the falling edge of the first clock signal CLK1 and the rising and falling edges of each of the second to fourth clock signals CLK2 to CLK4 may be simultaneously adjusted, a lock time may be shortened or a phase difference error may be corrected more accurately within a determined lock time.

When is the semiconductor device 400 determines that the lock time has ended in S150, the semiconductor device 400 may output first to eighth clock signals CLK1 to CLK8 (S160). When the lock time ends, a main phase splitter 410 may receive the first to fourth clock signals CLK1 to CLK4, and may output the first to eighth clock signals CLK1 to CLK8.

For example, the main phase splitter 410 may output a fifth clock signal CLK5 having a rising edge at the same timing as a falling edge of the first clock signal CLK1, and a sixth clock signal CLK6 having a rising edge at the same timing as a falling edge of the second clock signal CLK2. Similarly, the main phase splitter 410 may output a seventh clock signal CLK7 having a rising edge at the same timing as a falling edge of the third clock signal CLK3, and an eighth clock signal CLK8 having a rising edge at the same timing as a falling edge of the fourth clock signal CLK4. Since timing of the falling edge of the first clock signal CLK1 and the rising and falling edges of each of the second to fourth clock signals CLK2 to CLK4 may be adjusted within the lock time, a phase difference error between the first to eighth clock signals CLK1 to CLK8 output by the main phase splitter 410 may be minimized after the lock time.

Figure 20:
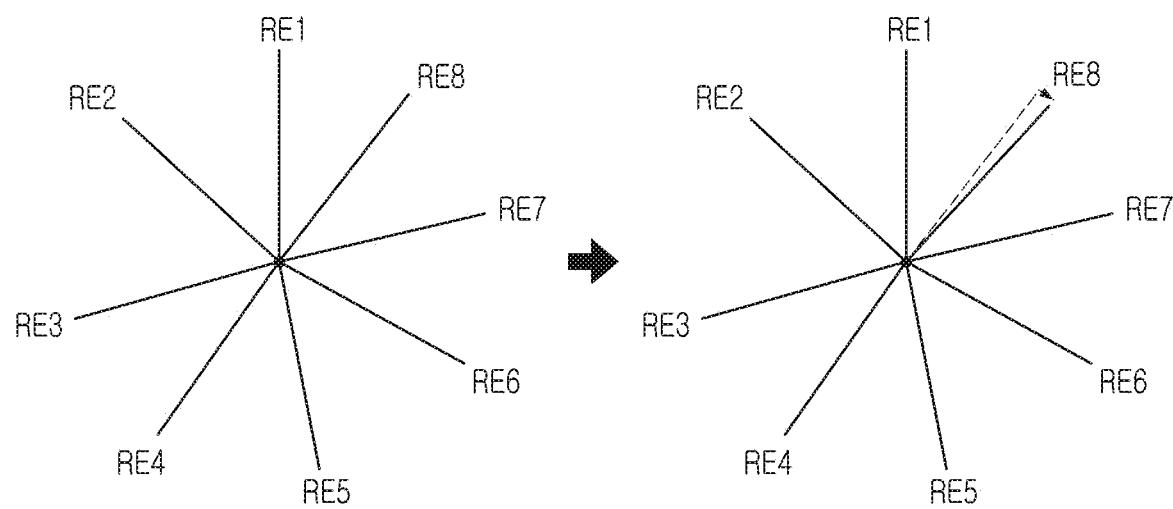
FIGS. 20 to 22 are views illustrating an operation of a semiconductor device according to some example embodiments.
Figure 21:
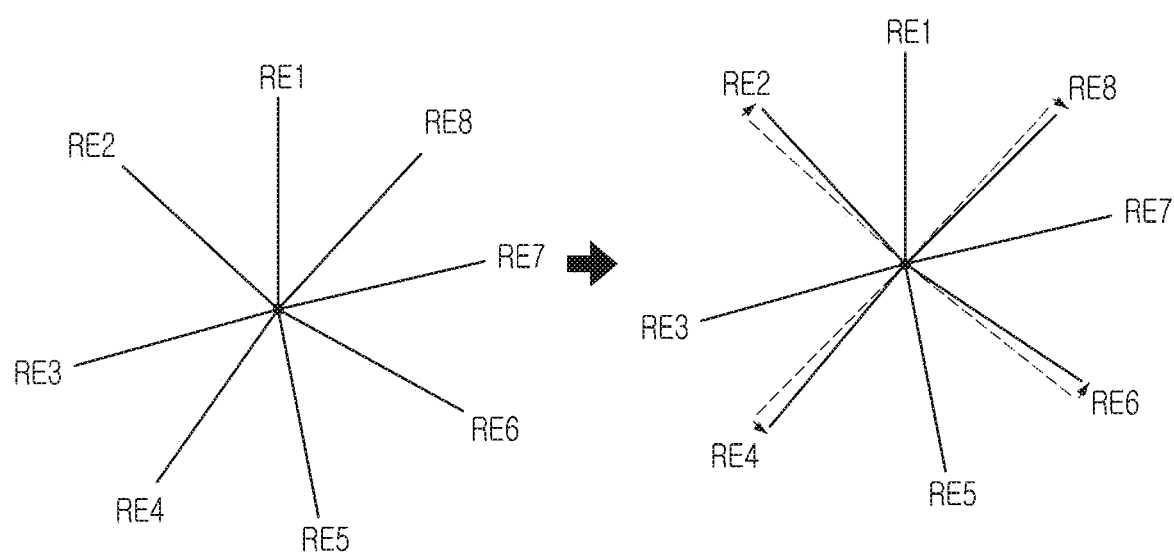
Figure 22:
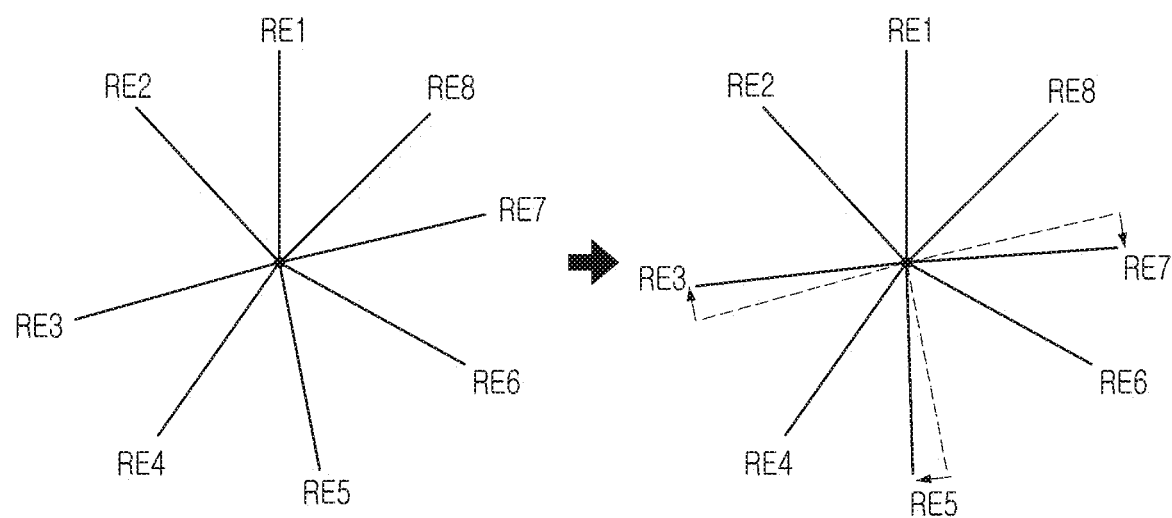

FIGS. 20 to 22 are views illustrating an operation of a semiconductor device according to some example embodiments.

FIGS. 20 to 22 may be views illustrating an operation of a semiconductor device 400 described with reference to FIGS. 18 and 19, and may be views illustrating phase differences between rising edges RE1 to RE8 of first to eighth clock signals CLK1 to CLK8 generated by the semiconductor device 400. For example, the rising edges RE5 to RE8 of the fifth to eighth clock signals CLK5 to CLK8 may correspond to falling edges of the first to fourth clock signals CLK1 to CLK4, respectively.

Referring to FIG. 20, due to a phase difference error between the first clock signal CLK1 and the third clock signal CLK3, a phase difference between the rising edge RE1 of the first clock signal CLK1 and the rising edge RE3 of the third clock signal CLK3 may be greater than 90 degrees. Furthermore, it can be understood that a phase difference between the rising edge RE1 of the first clock signal CLK1 and the rising edge RE5 of the fifth clock signal CLK5 corresponding to the falling edge of the first clock signal CLK1 is greater than 180 degrees, and a duty ratio of the first clock signal CLK1 is greater than 50%.

FIG. 20 is a view illustrating an operation of the semiconductor device 400 during an initial unit time period immediately after the start of a lock time. During the initial unit time period, a first multiplexer 461 may select and transmit the first clock signal CLK1 and the fourth complementary clock signal to a first code generator 451, and the first code generator 451 may delay a phase of a fourth complementary clock signal by 45 degrees, to output a default code indicating a phase difference from the first clock signal CLK1.

The default code may be input to a fourth delay circuit 424, and the fourth delay circuit 424 may adjust timing of a falling edge of the fourth clock signal CLK4 with reference to the default code. In some example embodiments illustrated in FIG. 20, the fourth delay circuit 424 may advance the falling edge of the fourth clock signal CLK4.

As described above, after the initial unit time period, a first unit time period and a second unit time period may be repeated. FIG. 21 is a view illustrating an operation of the semiconductor device 400 during a first unit time period. During the first unit time period, the first multiplexer 461 may transmit the first clock signal CLK1 and the second clock signal CLK2 to the first code generator 451. The first code generator 451 may delay a phase of the first clock signal CLK1 by 45 degrees to compare a phase difference from the second clock signal CLK2, and may output a first phase code determined according to a comparison result to a second delay circuit 422. Referring to the first phase code, the second delay circuit 422 may adjust timing of the rising edge RE2 of the second clock signal CLK2, as illustrated in FIG. 21.

A second code generator 452 may receive the third clock signal CLK3 and the fourth clock signal CLK4 from a second multiplexer 462, may delay a phase of the fourth clock signal CLK4 by 45 degrees to compare a phase difference from the third clock signal CLK3, and may generate a second phase code according to a comparison result to output the same to the fourth delay circuit 424. The fourth delay circuit 424 may adjust timing of the rising edge RE4 of the fourth clock signal CLK4 with reference to the second phase code, as illustrated in FIG. 21.

A third code generator 453 may receive a first complementary clock signal and a second complementary clock signal from a third multiplexer 463. The third code generator 453 may delay a phase of the first complementary clock signal by 45 degrees, may compare a phase difference from the second complementary clock signal, and may generate a third phase code according to a comparison result. The second delay circuit 422 may adjust timing of the falling edge of the second clock signal CLK2 with reference to the third phase code, and as a result, timing of the rising edge RE6 of the sixth clock signal CLK6 may be adjusted, as illustrated in FIG. 21.

A fourth code generator 454 may receive a third complementary clock signal and a fourth complementary clock signal from a fourth multiplexer 464, may delay a phase of the third complementary clock signal by 45 degrees, and may compare a phase difference from the fourth complementary clock signal. The fourth code generator 454 may generate a fourth phase code according to a comparison result, to output the fourth phase code to the fourth delay circuit 424. The fourth delay circuit 424 may adjust timing of the falling edge of the fourth clock signal CLK4 with reference to the fourth phase code, and as a result, timing of the rising edge RE8 of the eighth clock signal CLK8 may be adjusted, as illustrated in FIG. 21.

FIG. 22 is a view illustrating an operation of the semiconductor device 400 during a second unit time period. During the second unit time period, the first multiplexer 461 may transmit the second clock signal CLK2 and the third clock signal CLK3 to the first code generator 451. The first code generator 451 may delay a phase of the second clock signal CLK2 by 45 degrees to compare a phase difference from the third clock signal CLK3, and may output a fifth phase code determined according to a comparison result to a third delay circuit 423. The third delay circuit 423 may adjust timing of the rising edge RE3 of the third clock signal CLK3 with reference to the fifth phase code, as illustrated in FIG. 22.

The second code generator 452 may receive the fourth clock signal CLK4 and the first complementary clock signal from the second multiplexer 462, may delay a phase of the fourth clock signal CLK4 by 45 degrees so as to compare a phase difference from the first complementary clock signal, and may generate a sixth phase code according to a comparison result to output the same to a first delay circuit 421. The first delay circuit 421 may adjust timing of the falling edge of the first clock signal CLK1 with reference to the sixth phase code, and as a result, timing of the rising edge RE5 of the fifth clock signal CLK5 may be adjusted, as illustrated in FIG. 22.

The third code generator 453 may receive the second complementary clock signal and the third complementary clock signal from the third multiplexer 463. The third code generator 453 may delay a phase of the second complementary clock signal by 45 degrees, may compare a phase difference from the third complementary clock signal, and may generate a seventh phase code according to a comparison result. The third delay circuit 423 may adjust timing of the falling edge of the third clock signal CLK3 with reference to the seventh phase code, and as a result, timing of the rising edge RE7 of the seventh clock signal CLK7 may be adjusted, as illustrated in FIG. 22.

The fourth code generator 454 may receive the fourth complementary clock signal and the first clock signal CLK1 from the fourth multiplexer 464, may delay a phase of the fourth complementary clock signal by 45 degrees, and may compare a phase difference from the first clock signal CLK1. The fourth code generator 454 may output an eighth phase code generated according to a comparison result, to the fourth delay circuit 424. The fourth delay circuit 424 may adjust timing of the falling edge of the fourth clock signal CLK4 with reference to the eighth phase code, and as a result, timing of the rising edge RE8 of the eighth clock signal CLK8 may be adjusted, as illustrated in FIG. 22.

As in the semiconductor device 300 described with reference to FIG. 7 and the semiconductor device 400 described with reference to FIG. 18, an operation of correcting a phase difference error according to some example embodiments may be applied to clock circuits of various semiconductor devices, regardless of the number of clock signals. For example, when a clock circuit needs or intends to output N clock signals, N/2 code generators and N/2 delay circuits may be used to implement a clock circuit that may quickly and accurately correct a phase difference error during a lock time.

Each of the N/2 code generators may receive a pair of selection clock signals, may generate a phase code based on the pair of selection clock signals, and may output the phase code to the N/2 delay circuits. For example, the pair of selection clock signals input to each of the N/2 code generators may be different from each other, and the number of all of the selection clock signals input to the N/2 code generators may be N.

Each of the N/2 delay circuits may adjust a rising edge and/or a falling edge of clock signals that are received from an external host in response to the phase code. For example, the N/2 delay circuits may receive N/2 clock signals having different phases from the external host. Within the lock time, each of the N/2 delay circuits may adjust timing of a rising edge and/or a falling edge of at least one of the N/2 clock signals with reference to the phase code provided by the N/2 code generators, and, accordingly, to adjust a phase of each of the N clock signals output by the clock circuit, to remove a phase error between the N/2 clock signals.

According to various example embodiments, two or more phase codes, among phase codes adjusting a phase of a respective rising edge and a phase of a respective falling edge of a first clock signal and a second clock signal during a lock time, are generated at the same time, and a delay circuit may receive the two or more phase codes to adjust two or more of the respective rising edge and the respective falling edge of the first clock signal and the second clock signal. Therefore, it may be possible to shorten a lock time for adjusting phases of a plurality of clock signals to be generated, based on the first clock signal and the second clock signal. Alternatively or additionally, a phase code having more bits in a limited lock time may be generated to adjust the phases of the plurality of clock signals, to control more accurately a phase difference of the plurality of clock signals.

Various advantages and/or effects of inventive concepts are not limited to the above-described contents, and can be understood more easily in the process of describing specific example embodiments of inventive concepts.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

While various example embodiments have been illustrated and described above, it will be apparent to those of ordinary skill in the art that modifications and variations could be made without departing from the scope of inventive concepts as defined by the appended claims. Example embodiments are not necessarily mutually exclusive with one another. For example, some example embodiments may include one or more features described with reference to one or more figures, and may also include one or more other features described with reference to one or more other figures.

What is claimed is:

1. A semiconductor device comprising:
a clock receiver configured to receive from an external semiconductor device a first clock signal and a second clock signal having a phase difference from the first clock signal;
a delay circuit configured to adjust at least one of a falling edge of the first clock signal, a rising edge of the second clock signal, and a falling edge of the second clock signal;
a phase splitter configured to receive the first clock signal so as to output a first complementary clock signal, which is a complementary signal of the first clock signal, and to receive the second clock signal so as to output a second complementary clock signal, which is a complementary signal of the second clock signal; and
a code generator configured to output phase codes to the delay circuit,
wherein the code generator is configured to output, to the delay circuit during a first unit time period a first phase code adjusting a phase difference between the first clock signal and the second clock signal and a second phase code adjusting a phase difference between the first complementary clock signal and the second complementary clock signal, and to output to the delay circuit during a second unit time period, different from the first unit time period a third phase code adjusting a phase difference between the second clock signal and the first complementary clock signal and a fourth phase code adjusting a phase difference between the first clock signal and the second complementary clock signal.

2. The semiconductor device of claim 1, wherein the phase splitter comprises:
a first phase splitter configured to generate the first complementary clock signal having a rising edge at the falling edge of the first clock signal; and
a second phase splitter configured to generate the second complementary clock signal having a rising edge at the falling edge of the second clock signal.

3. The semiconductor device of claim 1, wherein the delay circuit is configured to adjust the rising edge of the second clock signal based on the first phase code, to adjust the falling edge of the second clock signal based on the second phase code, to adjust the falling edge of the first clock signal based on the third phase code, and to adjust the falling edge of the second clock signal based on the fourth phase code.

4. The semiconductor device of claim 1, wherein the code generator is configured to output only a default code adjusting the phase difference between the first clock signal and the second complementary clock signal to the delay circuit during an initial unit time period, earlier to the first unit time period.

5. The semiconductor device of claim 4, wherein, during the initial unit time period, the delay circuit is configured to adjust only the falling edge of the second clock signal in response to the default code.

6. The semiconductor device of claim 1, further comprising:
a clock tree connected between an output terminal of the delay circuit and an input terminal of the phase splitter, wherein the clock tree includes a plurality of repeaters.

7. The semiconductor device of claim 1, wherein the code generator is configured to output the first to fourth phase codes to the delay circuit while the first unit time period and the second unit time period are repeated within a lock time.

8. The semiconductor device of claim 7, wherein, in response to the lock time ending, the rising edge of the second clock signal has a phase difference of 90 degrees, a rising edge of the first complementary clock signal has a phase difference of 180 degrees, and a rising edge of the second complementary clock signal has a phase difference of 270 degrees, based on a rising edge of the first clock signal.

9. A semiconductor device comprising:
a first delay circuit configured to adjust a falling edge of a first clock signal;
a second delay circuit configured to adjust a rising edge and a falling edge of a second clock signal having a phase different from a phase of the first clock signal;
a first phase splitter configured to receive the first clock signal from the first delay circuit and to output the first clock signal and a first complementary clock signal, which is a complementary signal of the first clock signal;

a second phase splitter configured to receive the second clock signal from the second delay circuit and to output the second clock signal and a second complementary clock signal, which is a complementary signal of the second clock signal; and a first code generator and a second code generator that are configured to receive a portion of the first clock signal, the first complementary clock signal, the second clock signal, the second complementary clock signal, and to output phase codes to at least one of the first delay circuit and the second delay circuit.

10. The semiconductor device of claim 9, wherein the first code generator is configured to output a first phase code adjusting a phase difference between the first clock signal and the second clock signal, while the second code generator is configured to output a second phase code adjusting a phase difference between the first complementary clock signal and the second complementary clock signal.

11. The semiconductor device of claim 9, wherein the first code generator is configured to output a third phase code adjusting a phase difference between the second clock signal and the first complementary clock signal, while the second code generator outputs a fourth phase code adjusting a phase difference between the first clock signal and the second complementary clock signal.

12. The semiconductor device of claim 9, further comprising:

a first multiplexer configured to select two first selection clock signals from the first clock signal, the first complementary clock signal, the second clock signal, and the second complementary clock signal, and to transmit the first selection clock signals to the first code generator; and a second multiplexer configured to select two second selection clock signals from the first clock signal, the first complementary clock signal, the second clock signal, and the second complementary clock signal, and to transmit the second selection clock signals to the second code generator.

13. The semiconductor device of claim 12, wherein at least one of the first selection clock signals is different from each of the second selection clock signals.

14. The semiconductor device of claim 12, wherein
one of the first selection clock signals has a complementary relationship with one of the second selection clock signals, another one of the first selection clock signals has a complementary relationship with another one of the second selection clock signals.

15. The semiconductor device of claim 12, wherein
the first multiplexer is configured to select the first selection clock signals from the first clock signal, the second clock signal, and the first complementary clock signal, and
the second multiplexer is configured to select the second selection clock signals from the first clock signal, the first complementary clock signal, and the second complementary clock signal.

16. A semiconductor device comprising:
a phase splitter configured to output a plurality of clock signals having different phases using a plurality of external clock signals having different phases;
a plurality of code generators configured to receive a pair of selection clock signals determined from the plurality of clock signals, and to output a phase code corresponding to a phase difference error between the pair of selection clock signals; and
a delay circuit configured to adjust at least at least partly simultaneously two of a rising edge and a falling edge of each of the plurality of external clock signals with reference to the phase code during a lock time of the external clock signals.

17. The semiconductor device of claim 16, wherein the pair of selection clock signals input to each of the plurality of code generators are different from each other.

18. The semiconductor device of claim 16, wherein a number of the pair of selection clock signals input to the plurality of code generators is equal to a number of the plurality of clock signals.

19. The semiconductor device of claim 16, wherein, during at least a portion of the lock time, the delay circuit is configured to at least partly simultaneously adjust a rising edge of one external clock signal of the plurality of external clock signals and a falling edge of a different external clock signal of the plurality of external clock signals.

20. The semiconductor device of claim 16, wherein, during at least a portion of the lock time, the delay circuit is configured to at least partly simultaneously adjust a rising edge and a falling edge of one external clock signal of the plurality of external clock signals.

* * * * *